US011063798B2

(12) United States Patent
Aggarwal

(10) Patent No.: US 11,063,798 B2
(45) Date of Patent: Jul. 13, 2021

(54) HIGH SPECTRAL EFFICIENCY ZERO BANDWIDTH MODULATION PROCESS WITHOUT SIDE BANDS

(71) Applicant: Rakesh Aggarwal, New Delhi (IN)

(72) Inventor: Rakesh Aggarwal, New Delhi (IN)

(*) Notice: Subject to any disclaimer, the term of this patent is extended or adjusted under 35 U.S.C. 154(b) by 0 days.

(21) Appl. No.: 17/154,311

(22) Filed: Jan. 21, 2021

(65) Prior Publication Data

US 2021/0144035 A1      May 13, 2021

Related U.S. Application Data

(60) Division of application No. 16/870,064, filed on May 8, 2020, which is a continuation of application No. PCT/IB2019/055029, filed on Jun. 17, 2019.

(30) Foreign Application Priority Data

Jun. 18, 2018 (IN) ............................ 201811022779

(51) Int. Cl.
*H03C 1/52* (2006.01)
*H04L 27/04* (2006.01)

(52) U.S. Cl.
CPC .................................... *H04L 27/04* (2013.01)

(58) Field of Classification Search
CPC ..... H04L 27/04; H04L 27/00; H04L 27/2602; H04L 27/361; H03F 3/24
USPC ................................ 375/300, 295, 219, 316
See application file for complete search history.

(56) References Cited

U.S. PATENT DOCUMENTS

| | | | |
|---|---|---|---|
| 4,841,409 A | 6/1989 | Kalwar | |
| 6,647,250 B1 | 11/2003 | Bultman et al. | |
| 2005/0232368 A1 | 10/2005 | Brown et al. | |
| 2012/0196551 A1* | 8/2012 | Gomez | H04B 1/0003 455/226.1 |

FOREIGN PATENT DOCUMENTS

| | | |
|---|---|---|
| CN | 108023548 A | 5/2018 |
| EP | 0273165 A2 | 11/1987 |
| WO | WO-9103899 A1 * 3/1991 | ............. H04L 27/04 |

OTHER PUBLICATIONS

International Search Report issued by the International Search Authority for corresponding International Application No. PCT/IB2019/055029, dated Sep. 20, 2019.

\* cited by examiner

*Primary Examiner* — Zewdu A Kassa
(74) *Attorney, Agent, or Firm* — Myers Wolin, LLC

(57) ABSTRACT

A method for transmission of signal is provided, the method comprising the steps of receiving one or more modulating signals, generating one or more modulated sinusoidal carrier waves with zero side bands, including one or more sine wave cycles at carrier frequency that have a predetermined one or more properties, defined for complete cycle at the beginning of each sine cycle at one or more zero voltage crossing points in accordance with the one or more values of the one or more modulating signals. The one or more predetermined properties to change, is selected from group of amplitude, frequency, phase, time period and combinations thereof.

21 Claims, 38 Drawing Sheets

HIGH SPECTRAL EFFICIENCY ZERO BANDWIDTH MODULATION PROCESS WITHOUT SIDE BANDS

CROSS-REFERENCE TO RELATED APPLICATIONS

This application is a divisional application of U.S. application Ser. No. 16/870,064, filed May 8, 2020, which is a continuation under 35 U.S.C. § 120 of International Application PCT/IB2019/055029, filed Jun. 17, 2019, which claims priority to Indian Patent Application No. 201811022779, filed Jun. 18, 2018, the contents of each of which are incorporated by reference herein.

FIELD OF THE INVENTION

The present invention relates to field of communications and generally to transmission of radio signals and more particularly to transmission of radio signals minimizing sidebands.

BACKGROUND OF THE INVENTION

The known modulation apparatus and modulation processes are believed to contain all the information in sidebands and require finite bandwidth which is proportionate to highest signal frequency. The technique is universally applicable to amplitude modulation, frequency modulation, phase modulation, on/off keying and many combinations of these processes all require side bands to carry the information. With all known modulation processes require higher modulated carrier bandwidth, in proportion to highest modulating signal frequency and highest data rate. The RF carrier is an electromagnetic wave having characteristic that can be modified from known reference according to modulating signal. Modulator is a device where the carrier and modulating signals come together to change carrier frequency properties to create modulated carrier.

Modulation process is known to continuously alter one or more sine wave characteristics of the carrier wave like amplitude, phase, frequency and other individually or in combinations. Such processes invariably produce intermodulation products resulting as sidebands, in modulated carrier wave output, which (side bands) are believed to carry all the signal information. These sidebands vary in amplitude and their bandwidth depending on various factors including type of modulation, type and quality of signal, reliability factors, carrier frequency, modulating signal bandwidth and others.

Sidebands in prior art are generally on both sides of the carrier known as upper side band and Lower side band and carry all the information. Some modulation systems transmit carrier with one sideband suppressed completely or partially to conserve transmission bandwidth.

Modulator having more than one carrier waves are known for carrying large data and wide band signals. Modulating signal may be of digital and/or analog types such as voice, picture, text, data with wide variety of raw information, coded, multiplexed, compressed, encrypted or processed. Modulation process and devices known in prior art always have an associated demodulation process known as demodulator. Demodulation is known as a process of retrieving the original information from modulated carrier wave. Effect of demodulation apparatus and process is always exactly complimentary to the modulation process, separating the information and carrier wave, demodulators will have decoder, demultiplexer, decompressing, de-encrypting and other processes to faithfully recover information in original form.

In the prior art all known types of modulation processes consume spectrum in side bands with bandwidth according to highest frequency of modulating signal, making available only finite numbers of frequencies for transmission of information using air waves. This availability of limited numbers of frequencies has resulted in government regulating the resource. The regulation also ensures non-conflicting and fair use of this limited resource. Demand far outstrips the supply in numbers of modulating frequencies available for commercial and public use thus deny it to some.

In view of the above facts, there is a need in the art for more efficient use of available spectrum to convey maximum information while consuming minimum bandwidth of the spectrum for each Radio Frequency modulating signal. The need for improvement in process to conserve spectrum bandwidth using a variety of modulation types in various modes of radio frequency communication system is very much there.

OBJECT OF THE INVENTION

An object of the present invention is to produce modulated sine wave carrier with zero side bands for transmission of signals and use sine wave carrier frequency itself to carry the information.

Another object of the present invention is to make carrier frequency itself to carry all the information, to reduce the bandwidth requirement in communication system to zero.

Another object of the present invention is to remove completely all sidebands produced during modulation process to zero and make it highly spectrally efficient.

SUMMARY OF THE INVENTION

The present invention is described herein after by various embodiments. This invention may, however, be embodied in many different forms and should not be construed as limited to the embodiment set forth herein.

According to a first aspect of the present invention, a method for transmission to carry signals using only the carrier frequency with zero side bands is provided. The method comprising the steps of receiving one or more modulating signals selected from a group comprising one or more digital signals, one or more analog signals and combinations thereof, generating one or more modulated sinusoidal carrier waves with zero side bands, including one or more wave cycles that have predetermined one or more properties, defined at one or more zero voltage crossing points for the complete sine wave cycle in accordance with the one or more values of the one or more modulating signals.

The one or more modulated sine wave cycles with zero side bands generated by invented method are selected from a group comprising one or more sine wave cycles, one or more zero voltage cycles, one or more reference cycles and combination thereof.

The one or more wave cycles are achieved if each cycle of the one or more modulated sinusoidal carrier waves with zero side bands is configured to start only at the one or more zero voltage crossing points and terminate only at the consecutive one or more zero voltage crossing points after a predefined period on completion of complete cycle with sine wave properties.

The one or more properties of each cycle of the one or more wave cycles of the one or more modulated sinusoidal carrier waves with zero side bands is configured to change only at zero crossing point in beginning of the cycle in proportion to one or more values of the one or more modulating signals only after completion of each cycle of the one or more wave cycles defined at each of the one or more zero voltage crossing points.

The one or more properties of each of the one or more wave cycles of the one or more modulated sinusoidal carrier waves with zero side bands represents the one or more values of modulating signal.

The each cycle of the one or more modulated sinusoidal carrier waves with zero side bands generated is configured to retain pure sine wave properties. Effect of the modulating signal is applied to each complete cycle of the carrier sine wave only at the zero crossing point at the beginning of each sine wave cycle and for the entire sine wave cycle in a cycle by cycle process, thus not generating any side bands.

In accordance with an embodiment of the present invention, the one or more carrier sine wave cycles generated are selected from the group comprising half wave cycles, full wave cycles, Zero voltage cycles, and a combination thereof. Property of these cycles generated includes pure sine wave function for each cycle of the one or more sine wave cycles In accordance with an embodiment of the present invention, the one or more zero voltage cycles are the one or more cycles of the one or more modulated sinusoidal carrier waves with zero side bands having features selected from a group comprising zero amplitude, predefined phase angle, predefined frequency, predetermined time period and combination thereof.

In accordance with an embodiment of the present invention, the one or more zero voltage cycles are laying among the one or more sine wave cycles.

In accordance with an embodiment of the present invention, the one or more zero voltage crossing points are points where phase angle for each of the one or more modulated sinusoidal carrier waves with zero side bands is zero or integer multiple of $\pi$.

In accordance with an embodiment of the present invention, the one or more modulated sinusoidal carrier waves with zero side bands are configured to travel to a predetermined distance using conductors, radiated waves and optical mediums. In accordance with an embodiment of the present invention, the one or more properties of each cycle of the one or more wave cycles of the one or more modulated sinusoidal carrier waves with zero side bands are selected from a group comprising one or more predetermined amplitudes, one or more predetermined frequencies, one or more predetermined phase angles, one or more predetermined time period and combination thereof.

Variable Amplitude Property (AM)

In accordance with an embodiment of the present invention, the one or more properties of each cycle of the one or more wave cycles of the one or more modulated sinusoidal carrier waves with zero side bands generated is the one or more predetermined amplitudes, having a constant frequency and a constant phase angle. In accordance with an embodiment of the present invention, each cycle of the one or more wave cycles of the one or more modulated sinusoidal carrier waves with zero side bands generated is having variable amplitudes generating Invented side bands free Amplitude Modulation.

Variable Frequency Property (FM)

In accordance with an embodiment of the present invention, the one or more properties of each of the one or more wave cycles of the one or more modulated sinusoidal carrier waves with zero side bands generated is the one or more predetermined frequencies, having a constant amplitude and a constant phase angle.

In accordance with an embodiment of the present invention, each of is the one or more wave cycles of the one or more modulated sinusoidal carrier waves with zero side bands generated is having variable frequencies generating Invented side bands free Frequency Modulation.

In accordance with an embodiment of the present invention, the modulated sinusoidal carrier wave with zero side bands is further comprising the step of carrying signals of higher frequency than the one or more predetermined frequencies of modulated sinusoidal carrier wave with zero side bands.

Variable Phase Property (PM)

In accordance with an embodiment of the present invention, the one or more properties of each cycle of the one or more wave cycles of the one or more modulated sinusoidal carrier waves with zero side bands generated is selected from a group comprising the one or more predetermined phase angles, the one or more predetermined time period and a combination thereof, having a constant amplitude and a constant frequency.

In accordance with an embodiment of the present invention, the one or more wave cycles of the one or more modulated sinusoidal carrier waves with zero side bands generated is having variable phase angles generating Invented side bands free Phase Modulation.

Variable AM, PM & FM and Combination of

In accordance with an embodiment of the present invention, the one or more wave cycles of the one or more modulated sinusoidal carrier waves with zero side bands generated is having variable phase angles, variable frequency, variable phase angle, variable time period and combination thereof in proportion to value of one or more modulating signals generating Invented side bands free various types of modulations.

The one or more wave cycles are selected from a group comprising one or more sine wave cycles, one or more half wave cycles, one or more zero voltage cycles, one or more reference cycles and combination thereof.

In accordance with an embodiment of the present invention, the one or more zero voltage cycles are the one or more cycles of the one or more modulated sinusoidal carrier waves with zero side bands having features selected from a group comprising zero amplitude, predefined phase angle, predefined frequency, predetermined time period and combination thereof.

According to a second aspect of the present invention, a method and system for reception of a signal is provided. The method comprising the steps of receiving one or more modulated sinusoidal carrier waves with zero side bands with frequency selection, optimising them with amplification for the zero bandwidth requirement, processing them with tuned amplifiers, heterodyne process generating upper and lower IF frequencies and other processes for, recovering signal efficiently from them and providing one or more output signal derived from carrier frequency itself without the need of side bands.

In accordance with an embodiment of the present invention, optimising the one or more modulated sinusoidal carrier waves with zero side bands includes stabilizing the received one or more modulated sinusoidal carrier waves with zero side bands, filtering the stabilized one or more modulated sinusoidal carrier waves with zero side bands and eliminating noise and interference from the one or more interfering sinusoidal carrier waves.

In accordance with an embodiment of the present invention, processing further includes step of converting the one or more modulated sinusoidal carrier waves with zero side bands into one or more pulses.

In accordance with an embodiment of the present invention, processing the one or more modulated sinusoidal carrier wave with zero side bands further includes analysing one or more properties of each cycle of the one or more wave cycles of the one or more modulated sinusoidal carrier waves with zero side bands at and in between zero voltage crossing points to determine value of one or more properties of each cycle of the one is or more wave cycles of the one or more modulated sinusoidal carrier waves with zero side bands.

In accordance with an embodiment of the present invention, the one or more recovered signals are further processed/decoded to get the one or more modulating signals to get one or more predetermined outputs comprising one or more digital signals, one or more analog signals and combinations thereof.

In accordance with an embodiment of the present invention, the steps of recovering signals from the one or more modulated sinusoidal carrier waves with zero side bands having the one or more properties of each cycle of the one or more wave cycles of the received one or more modulated sinusoidal carrier waves with zero side bands selected from a group comprising one or more predetermined amplitudes, one or more predetermined frequencies, one or more predetermined phase angles, one or more predetermined time periods and combinations thereof.

In accordance with an embodiment of the present invention, the one or more received modulated sinusoidal carrier waves with zero side bands having the one or more properties of each cycle of the one or more wave cycles of generated/received one or more modulated sinusoidal carrier waves with zero side bands is the one or more predetermined amplitudes, having a constant frequency and a constant phase angle.

In accordance with an embodiment of the present invention, the one or more received modulated sinusoidal carrier waves with zero side bands having the one or more properties of each cycle of the one or more wave cycles of received one or more modulated sinusoidal carrier waves with zero side bands is the one or more predetermined frequencies, having a constant amplitude and a constant phase angle.

In accordance with an embodiment of the present invention, the one or more received modulated sinusoidal carrier waves with zero side bands is having the one or more properties of each cycle of the one or more wave cycles of received one or more modulated sinusoidal carrier waves with zero side bands is the one or more predetermined phase angle, having a constant amplitude and a constant frequency.

In accordance with an embodiment of the present invention, a system for reception of modulated signals is provided, the system comprising a front end configured to select one or more carrier wave frequency and receive and amplify one or more modulated sinusoidal carrier waves with zero side bands, a stabilizing module configured to filter and optimise gain and bandwidth of the one or more modulated sinusoidal carrier waves with zero side bands. A processing module configured to process them with heterodyne and other processes and eliminate noise and interference, a recovery module configured to detect and recover data/signal from the one or more modulated sinusoidal carrier wave with zero side bands and process recovered signal to drive an output driver configured to provide the output signal comprising one or more digital signals, one or more analog signals and combinations thereof.

In accordance with an embodiment of the present invention, the processing module is further configured to convert the one or more modulated sinusoidal carrier waves with zero side bands into one or more pulses.

In accordance with an embodiment of the present invention, the processing module is configured to process the one or more modulated sinusoidal carrier waves with zero side bands further includes analyse one or more properties of each cycle of the one or more wave cycles of the one or more modulated sinusoidal carrier waves with zero side bands at zero voltage crossing points and between consecutive zero crossing points to determine value of one or more properties of each cycle of the one or more wave cycles of the one or more modulated sinusoidal carrier waves with zero side bands.

In accordance with an embodiment of the present invention, the one is or more modulated sinusoidal carrier waves with zero side bands have the one or more properties of each cycle of the one or more wave cycles of the one or more modulated sinusoidal carrier waves with zero side bands selected from a group comprising one or more predetermined amplitudes, one or more predetermined frequencies, one or more predetermined phase angles, one or more predetermined time periods and combination thereof.

According to a third aspect of the present invention, an apparatus for performing the functionalities described herein is provided.

BRIEF DESCRIPTION OF DRAWINGS

So that the manner in which the above recited features of the present invention can be understood in detail, a more particular to the description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, the invention may admit to other equally effective embodiments.

These and other features, benefits and advantages of the present invention will become apparent by reference to the following text figure, with like reference numbers referring to like structures across the views, wherein:

FIG. 11 illustrates the corrected wave form of reception of modulated sinusoidal carrier wave with zero side bands, in accordance with an embodiment of the present invention with predefined amplitude property;

CONCEPTUAL WORKING OF INVENTION DRAWINGS (FIG. 6A) AND (FIG. 11A)

Figure 38A:
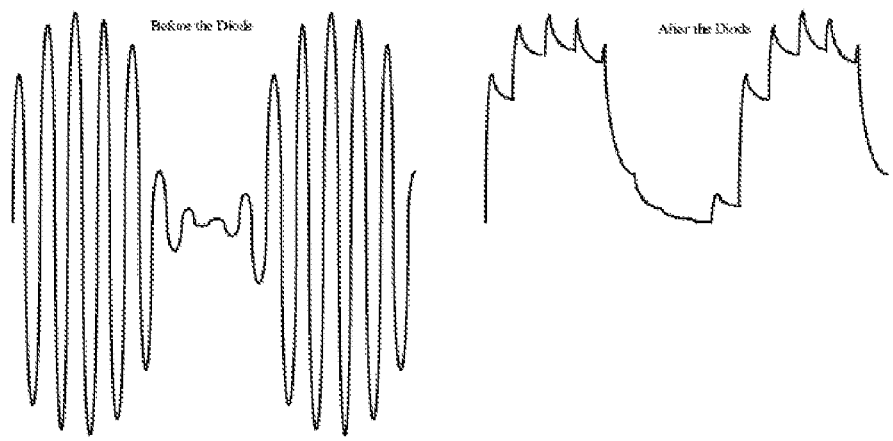
FIGS. 38a and 38b illustrate a conventional AM peak detector and its effect on peak value of carrier cycle.
Figure 38B:
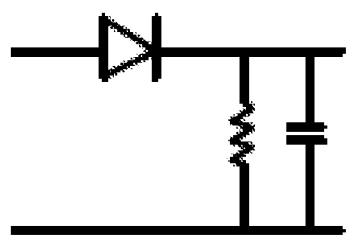

FIGS. 38a and 38b show that only the peak value of carrier cycle is used by the AM peak detector. The figure is a poorly implemented peak detector for highlighting modulated and detected signal. With frequency ratio of 10 to one is used in the figure and there are 10 cycle of the carrier cycle during one cycle of the signal. The detected signal waveform is showing positive spikes reaching the peak level of modulated carrier cycles and then drooping a bit. Deliberately the filter shown is of poor quality to show drooping of detected signal and peaks are rising to next peak of carrier. This shows that the detector is only taking the peak envelop value of the carrier cycles and rest of the sine cycle of the modulated carrier does not contribute any value to output.

This above example shows that each cycle of carrier is carrying its peak amplitude value which can be treated as sample value of modulating signal. It shows that peak value of each sine wave cycle of carrier wave acts as sample value of modulating signal and just the peak value of each carrier cycle is needs to reproduce original signal as long as the carrier frequency is sufficiently higher. For all practical purposes a better and appropriate filter needs to be used.

Keeping above example in mind following explanation in detail of the waveforms shown in (FIG. 6A) with (FIG. 11A) in accordance with an embodiment of the present invention will assist those skilled in the art to understand the working of invention. Which claims by forcing each complete sine wave cycle of the carrier to follow pure sine wave function, and by defining amplitude vector at beginning of the sine cycle at a zero voltage crossing point, it can carry large amount of information or data by the carrier frequency itself without generating any side bands.

The embodiment of FIG. 6A uses AES3 digital audio signals and a little understanding of digital signal format of AES3 format can assist those skilled in the art. AES3 is a 24 bit uncompressed stereo audio digital format allowing encoding the clock and the data together using, biphase mark code (BMC). This coding is polarity immune and every transition in level from "0 to 1" or from "1 to 0" represents a "logic 1", steady state either at high level or low level represents a "logic 0". More details on AES3 can be found at official AES site or at "https://en.wikipedia.org>wiki>AES3"

In an embodiment of the invented transmission process we generate one pure sine wave cycle at carrier frequency starting at zero crossing point and ending at another zero-crossing point for every transition. Between the transitions we generate zero voltage cycles which represent no transition in the modulating signal. Or to say we are either generating a pure sine wave cycle or generating nothing ensuring there are no side bands produced.

Figure 1:
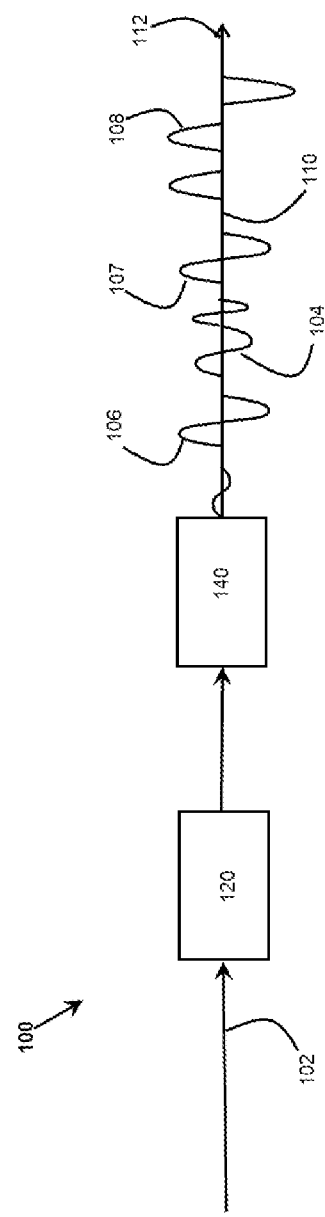
FIG. 1 illustrates a system to receive modulating signal and generate modulated sinusoidal carrier wave with zero side bands, in accordance with an embodiment of the present invention is having its properties selected from group of predefined amplitude, predefined frequency, predefined phase and combinations thereof.
Figure 8:
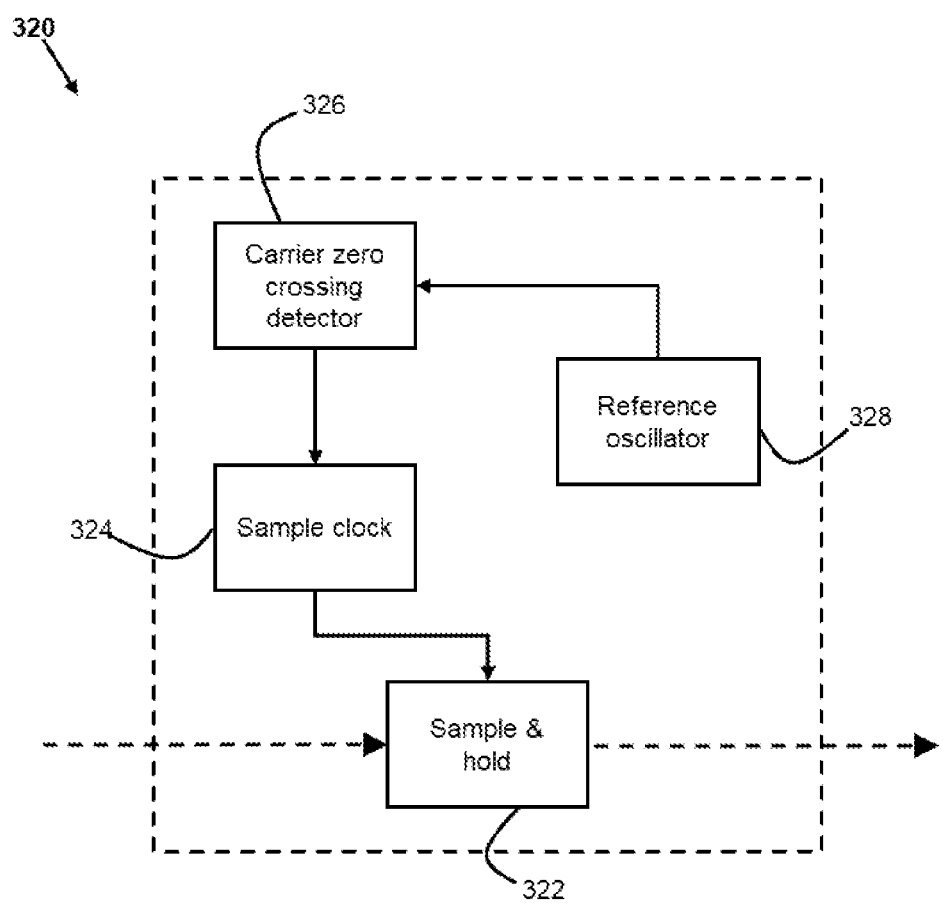
FIG. 8 illustrates an analog signal receiving module to receive analog modulating signals, in accordance with an embodiment of the present invention with predefined amplitude property.

The AES3 signal waveform is shown in (FIG. 6A2) with its bit clock shown for reference only in (FIG. 6A1). The actual data value is marked in (FIG. 6A3) which is coinciding with transitions. In accordance with an embodiment of the present invention, steps of converting each transition in input signal in to one 0° to 360° pure sine wave cycle, starting at zero crossing point and ending at subsequent zero crossing point at the carrier frequency are shown in FIG. 6A4 to FIG. 6A8.

Figure 4:
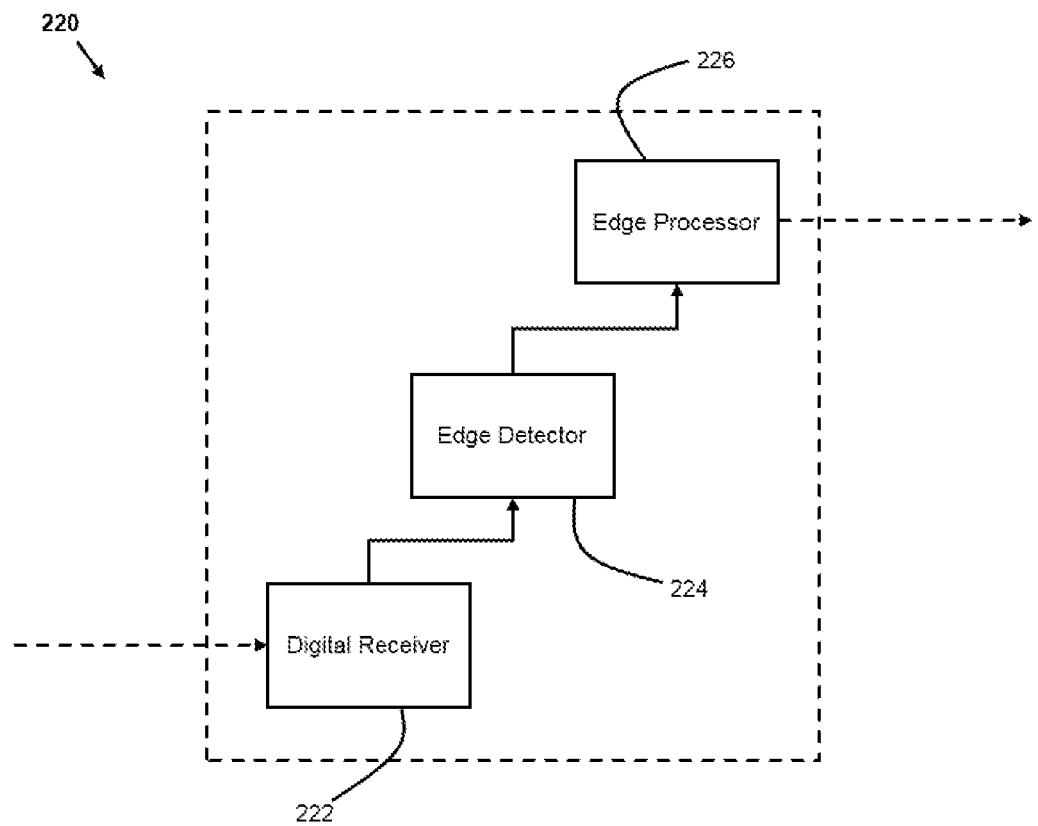
FIG. 4 illustrates a digital signal receiving module to receive digital modulating signals, in accordance with an embodiment of the present invention with predefined amplitude property.
Figure 5:
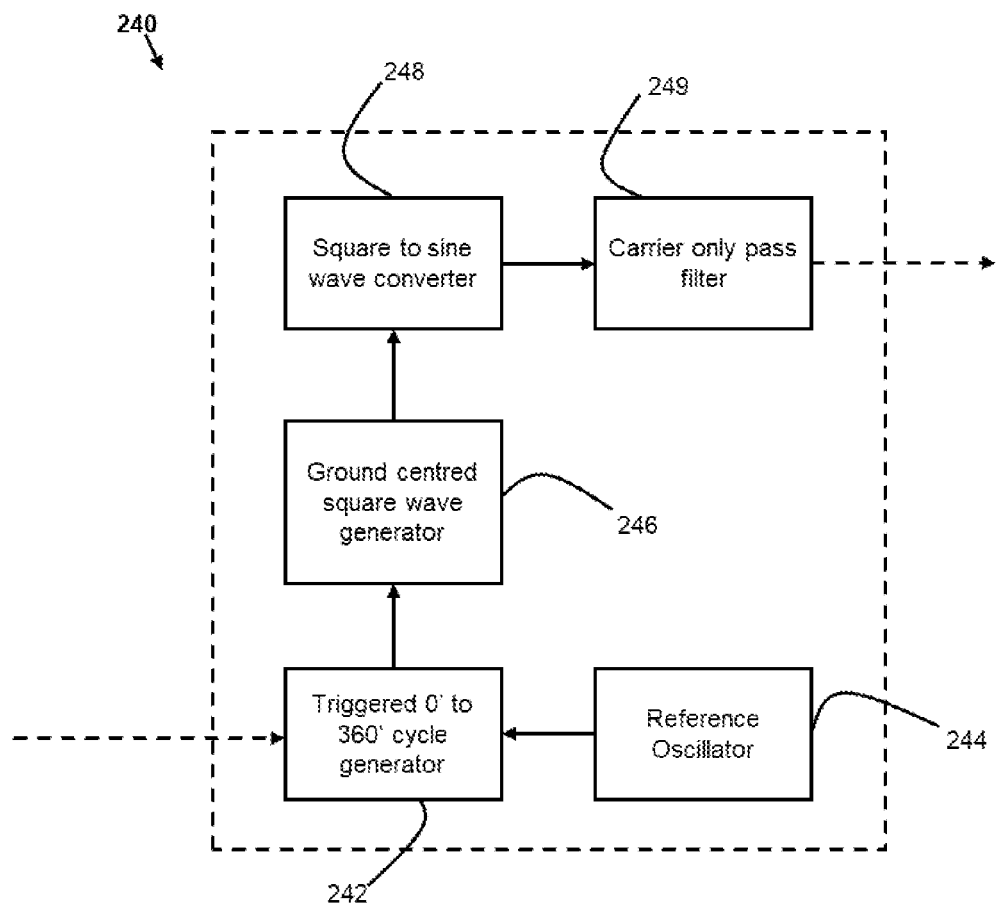
FIG. 5 illustrates digital carrier wave module for generating modulated sinusoidal carrier wave with zero side bands from digital modulating signal, in accordance with an embodiment of the present invention with predefined amplitude property.
Figure 6:
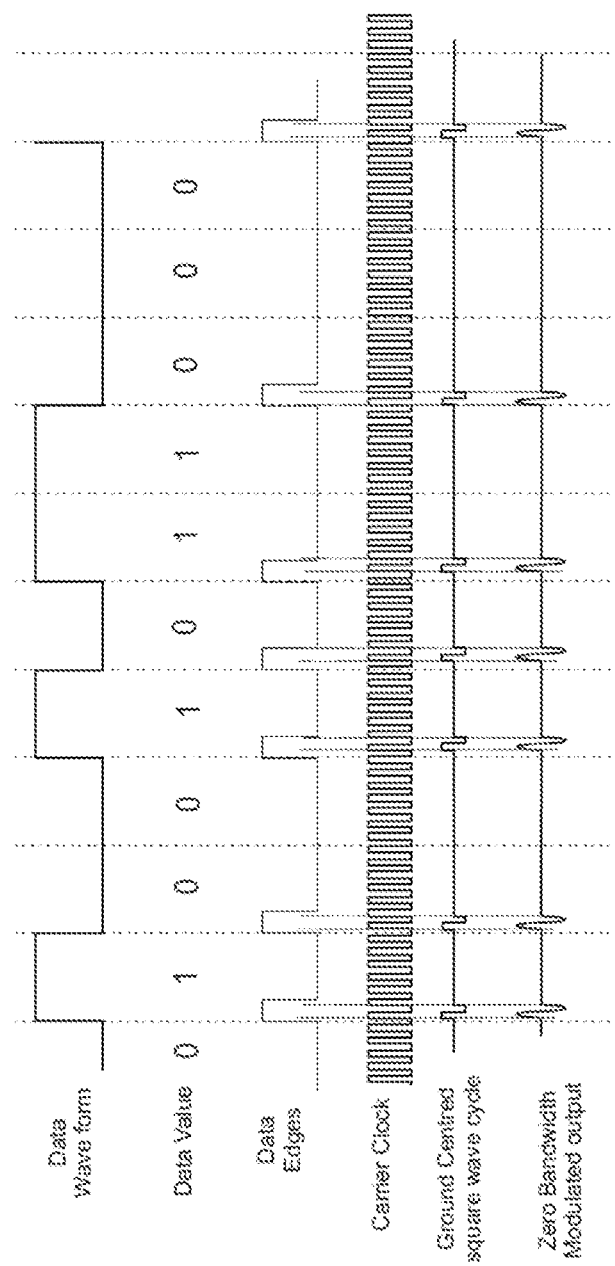
FIG. 6 illustrates the resultant wave form generation, in accordance with an embodiment of the present invention; with added reference wave forms with predefined amplitude property.

Data edge extractions waveform is shown in (FIG. 6A4). Carrier frequency clock is shown in (FIG. 6A5), which provides timing information to generate one cycle gate pulse corresponding to each transition in signal as shown in (FIG. 6A6). This pulse is used further to generate a ground centred square wave cycle, having half positive going and half negative going cycle. This ground centred wave cycle of (FIG. 6A7) is further passed through a filter to generate one pure sine wave cycle. (FIG. 6A8) shows the modulated sinusoidal carrier wave with zero side bands. Sine wave cycle (pure) of (FIG. 6A8) achieves the inventive step of starting carrier sine wave cycle at zero voltage crossing point and ends the carrier cycle at zero crossing point, only after completing one 0° to 360° pure sine wave cycle at the carrier frequency. Amplitude of the sine cycle is defined at the beginning of sine cycle. It uses zero voltage cycles for remaining time.

Thus, generated waveform of (FIG. 6A9) is similar to an "amplitude modulated wave form" with only two amplitude value, one is the amplitude of generated sine wave cycle and other being zero voltage cycle with zero amplitude. The sine wave cycles generated are configured to generate only pure carrier sine wave cycles with zero side bands. It is immaterial if the sine wave cycle starts with opposite polarity, as long as the cycle is a full sine wave cycle at carrier frequency as per appended claims. This invented method/system only generate modulated sine wave carrier cycles and does not generate any side bands is shown in (FIG. 6A9) which carries all the signal information within carrier frequency itself.

The key inventive step is to start each individual carrier cycle with its one or more properties defined, in proportion to modulating signal at cycle starting zero crossing point and end the cycle at consecutive zero crossing point on completion of one pure sine wave cycle, in a cycle by cycle generation process. Modulating signals can change property of carrier wave sine cycle only at the cycle start zero crossing point, for each complete sine wave cycle of the carrier. Generation of each sine wave cycle can only start with its properties defined at start of each cycle and once the sine wave cycle generation starts, it's property cannot be changed by modulating signal during the cycle. In the invented steps zero voltage cycles are valid cycles.

The invented transmission system does not have any side bands and thus it does not need any channel bandwidth, its maximum bandwidth capacity to carry wide band signals is much higher. The maximum bandwidth capacity of transmission system to carry wide band signals is also proportionate to the carrier frequency.

Modulating signal bandwidth capacity of the invented transmission system for faithful reception can be derived from nyquest theorem. The Nyquist Sampling Theorem states that: an analog signal waveform may be uniquely reconstructed, without error, from samples taken at equal time intervals. The sampling rate must be equal to, or greater than, twice the highest frequency component in the analog signal.

The receive system wave forms are shown in (FIG. 11A) which are complimentary to (FIG. 6A) and show how to recover original modulating signal from the modulated sinusoidal carrier waves with zero side bands. The receive system working looks like a conventional receiver as far as the steps like front end, AGC and associated heterodyne process, but differ in their optimisation for "side bands free modulated signal". In the invented method, the band width requirement in all these stages is as narrow as practically possible to pass only the pure carrier frequency and may be application dependent.

In a receiver embodiment of the present invention, amplitude of each sinusoidal carrier wave cycle (FIG. 11A2), received carries 1 bit data, representing transition in the original modulating signal. This one bit signal is recovered by slicing the selected, filtered, amplified modulated sinusoidal carrier waves with zero side bands and generate a logic pulse, representing the transition. This square pulse is used to toggle a flip flop to produce the original AES3 wave form shown in FIG. 11A7.

Common Documentation Practice/Abbreviations

While the present invention of transmitting large bandwidth signals by pure carrier frequency itself without needing side bands is described herein by way of example using embodiments and illustrative drawings, those skilled in the art will recognize that the invention is not limited to the embodiments of drawing or drawings described and are not intended to represent the scale of the various components. Further, some components that may form a part of the invention may not be illustrated in certain figures, for ease of illustration, and such omissions do not limit the embodiments outlined in any way. It should be understood that the drawings and detailed description there to are not intended to limit the invention to the particular form disclosed, but on the contrary, the invention is to cover all modifications, equivalents, and alternatives falling within the scope of the present invention as defined by the appended claims. As used throughout this description, the word "may" be used in a permissive sense (i.e. meaning having the potential to), rather than the mandatory sense, (i.e. meaning must). Further, the words "a" or "an" mean "at least one" and the word "plurality" means "one or more" unless otherwise mentioned. Furthermore, the terminology and phraseology used herein is solely used for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited, and is not intended to exclude other additives, components, integers or steps. Likewise, the term "comprising" is considered synonymous with the terms "including" or "containing" for applicable legal purposes. Any discussion of documents, acts, materials, devices, articles and the like are included in the specification solely for the purpose of providing a context for the present invention. It is not suggested or represented that any or all of these matters form part of the prior art base or were common general knowledge in the field relevant to the present invention.

In this disclosure, whenever a composition or an element or a group of elements is preceded with the transitional phrase "comprising", it is understood that we also contemplate the same composition, element or group of elements with transitional phrases "consisting of", "consisting", "selected from the group of consisting of, "including", or "is" preceding the recitation of the composition, element or group of elements and vice versa.

The present invention is described hereinafter by various embodiments with reference to the accompanying drawing, wherein reference numerals used in the accompanying drawing correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only and are not intended to limit the scope of the claims. In addition, a number of materials are identified as suitable for various facets of the implementations. These materials are to be treated as exemplary and are not intended to limit the scope of the invention.

The embodiments described are explained as hardware devices and some or all the embodiments can be implemented in embedded and or software-based enactment.

Transmission system may include one or more modules may be selected from but not limited to: encoder, decoder, encryption, DSP, compression, equaliser, emphasis, limiter, compressor, multiplexer, up/down converters, synchroniser, ADC, DAC, FPGA, divider, sample and hold, multiplier, divider, delay, compensators, combiner, divider, DDS, memory module, arbitrary waveform generator, switching, filtering, frequency synthesis, function generator, modulator, demodulator, detector, interpolator, finite impulse response processing, integrator, oscillator, multiplier, discriminator, phase lock loop, forward correction, pre correction, software defined radio, signal re-constructor and other to suit specific implementation For Example Predefined frequency range to include but not limited to ELF, VLF, LF, MF, HF, VHF, UHF, SHF, EHF bands (3 hz to 3000 Ghz). Amplitude range is to include but not limited to 0 Volts to $1 \times 10^9$ Volts. Phase range is to include but not limited to 0 to nrr phase angle. Time period range is to include but not limited to 0 seconds to $1 \times 10^6$ seconds.

DETAILED DESCRIPTION OF DRAWINGS

FIG. 1 illustrates a transmission system (100), to receive modulating signals (102) and generate modulated sinusoidal carrier waves with zero side bands (112) in accordance with an embodiment of the present invention, the one or more modulating signal (102) may be selected from a group comprising, but not limited to, one or more analog signals, one or more digital signals and a combination thereof. The one or more modulating signals (102) are received by a receiving module (120). The receiving module (120) may be, but not limited to, digital signal receiving module or analog signal receiving module or a combination thereof.

The receiving module (120) may be connected to a carrier wave module (140). The carrier wave module (140) may be, but not limited to, digital carrier wave module or analog carrier wave module or combination thereof. The carrier wave module (140) is configured to generate modulated sinusoidal carrier waves with zero side bands (112). The modulated sinusoidal carrier waves with zero side bands (112) may include, but not limited to, one or more wave cycles (106) having their one or more properties, selected from group comprising amplitude, frequency, phase, time period and combinations thereof, defined at the zero crossing point, at start of each sine cycle. The one or more wave cycles (106) may be selected from a group comprising, but not limited to, one or more sine wave cycles (107) and one or more zero voltage cycles (110). The one or more sine wave cycles (106) may be, but not limited to, half wave cycles (108) or full wave cycles (107). The one or more sine wave cycles (106) have their one or more properties defined at the zero crossing point, at start of each sine cycle and are configured to start at but not limited to the zero voltage crossing point and end at the consecutive zero voltage crossing point on completion of the cycle (106). The one or more zero voltage cycles (110) may have features selected from a group comprising, but not limited to, zero amplitude, predetermined phase angle, predetermined frequency, predetermined time period and combination thereof.

Figure 2:
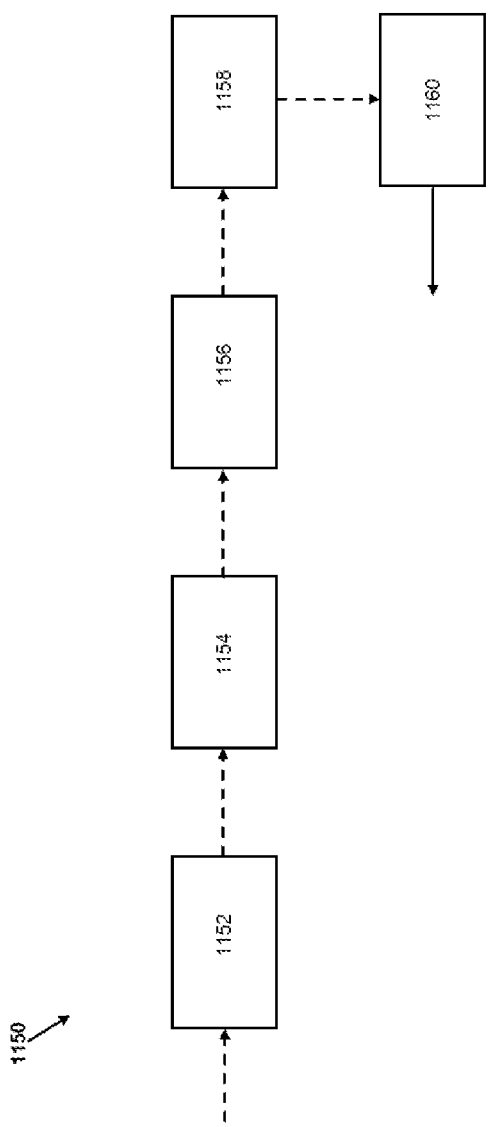
FIG. 2 illustrates a system for receiving modulated sinusoidal carrier wave with zero side bands to convert it into signals, in accordance with an embodiment of the present invention with predefined amplitude, predefined frequency, predefined phase and combinations thereof.

FIG. 2. illustrates a receiving system (1150) for receiving modulated sinusoidal carrier waves with zero side bands and to convert it into signals, in accordance with an embodiment of the present invention. The receive system comprises a front end (1152) optimised to receive modulated sinusoidal carrier waves with zero side bands and provide tuned RF Gain. The front end (1152) is connected to a stabilizing module (1154) configured to provide stable amplification and frequency selection with or without heterodyne process. The stabilizing module (1154) is connected to a processing module (1156) configured to provide further frequency selection, gain control and other parameter controls optimised for selection of carrier frequencies. The processing module (1156) is further connected to a signal recovery module (1158) configured to detect the signals from each cycle individually and collectively from the modulated sinusoidal carrier waves with zero side bands. The recovery module (1158) is connected to an output driver (1160) to form one or more output signals.

Figure 36:
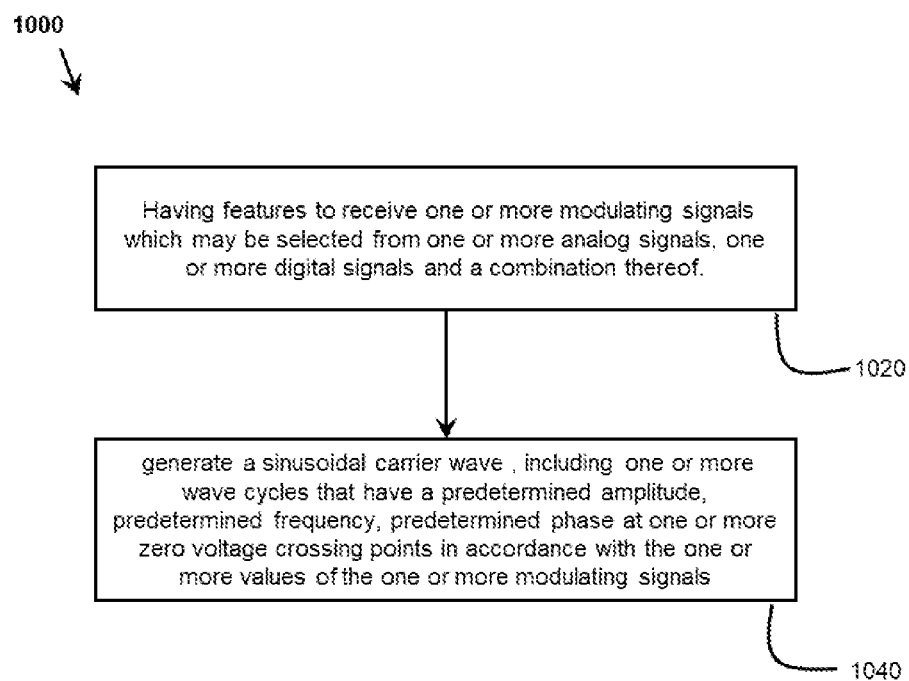
FIG. 36 illustrates a method of receiving modulating signal and generate modulated sinusoidal carrier wave with zero side bands, in accordance with an embodiment of the present invention with predetermined phase, frequency, amplitude, time period and combination of these properties.

The system (1150) may include one or more modules may be selected from but not limited to: encoder, decoder, decryption, DSP, de-compression, FFT, de-equaliser, de-emphasis, delimiter, decompressor, demultiplexer, up/down converters, synchroniser, ADC, DAC, multiplier, divider, delay, compensators, combiner, memory module, arbitrary waveform generator, PLL, switching, filtering, frequency synthesis, demodulator, discriminator, interpolator, impulse response processing, disintegrator, oscillator signal re-constructor detector, software defined radio and other to suit specific implementation FIG. 36 illustrates the transmission method (1000) of receiving modulating signal and generating modulated sinusoidal carrier wave with zero side bands, in accordance with an embodiment of the present invention. The method (1000) begins at the step 1020 where a receiving module (120) receives one or more modulating signals (102). At step 1020, the one or more modulating signals (102) may be selected from a group comprising one or more analog signals, one or more digital signals and a combination thereof. The one or more modulating signals (102) may have features selected from a group comprising one or more amplitudes, one or more frequencies, one or more time period, one or more phase angles, one or more time periods and combinations thereof. The receiving module (120) may be, but not limited to, a digital signal receiving module (120) or an analog signal receiving module (120) or a combination thereof.

At step 1040, a modulated sinusoidal carrier wave with zero side bands (112) is generated by a carrier wave module (140). The generated modulated sinusoidal carrier wave with zero side bands (112) includes one or more wave cycles (106) that have predetermined one or more properties defined at cycle starting for each complete sine wave cycle, at one or more zero voltage crossing points in accordance with the one or more values of the one or more modulating signals (102). The one or more generated wave cycles (106) are configured to start at but not limited to the zero voltage crossing point and end at but not limited to the consecutive zero voltage crossing point completing each cycle with constant sine wave properties in a cycle by cycle process. The one or more properties of each cycle of the one or more wave cycles (106) of the one or more modulated sinusoidal carrier waves with zero side bands (112) may be, but not limited to, selected from a group comprising one or more predetermined amplitudes, one or more predetermined frequencies, one or more predetermined phase angles, one or more predetermined time period and combination thereof. The carrier wave module (140) may be, but not limited to, digital carrier wave module (140) or analog carrier wave module (140) or combination of both.

Figure 37:
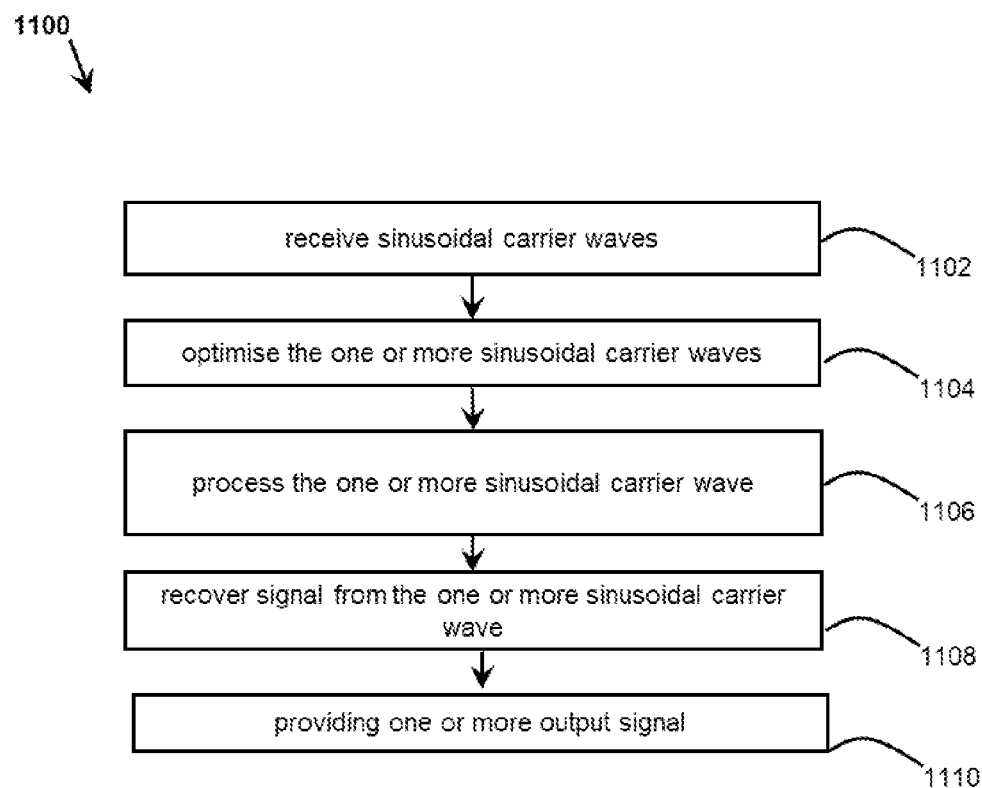
FIG. 37 illustrates a method of receiving modulated sinusoidal carrier wave with zero side bands to convert it into signals, in accordance with an embodiment of the present invention with predetermined phase, frequency, amplitude and combination of these properties.

The method 1100 of receiving modulated sinusoidal carrier waves with zero side bands to convert them into modulating signals is illustrated FIG. 37 in accordance with an embodiment of the present invention. The method 1100 elaborates process wherein the modulated sinusoidal carrier waves with zero side bands produced by the carrier wave module are received by a system to convert them into signals. The method 1100 begins at step 1102 where the modulated sinusoidal carrier waves with zero side bands are received and selectively amplified by a front end (1152). The front end (1152) is configured and optimised to receive one or more modulated sinusoidal carrier waves with zero side bands, includes receive, amplify stabilizing module (1154). At step 1104, the stabilizing module (1154) optimises the one or more modulated sinusoidal carrier waves with zero side bands, which may include but not limited to stabilizing the gain, filtering and amplifying them, and eliminating noise and interference from the one or more interfering sinusoidal carrier waves. The optimised modulated sinusoidal carrier waves with zero side bands may be received by a processing module (1156). At step 1106, the one or more modulated sinusoidal carrier waves with zero side bands may be received by a processing module (1156) and are processed to amplify, filter, gain control and optimise the gain and may generate upper or lower intermediate frequency by heterodyne process.

Where in the processing module (1156) may be further configured to convert the one or more modulated sinusoidal carrier waves with zero side bands into one or more pulses.

The processing module (1156) is further configured to process the one or more modulated sinusoidal carrier waves further includes analyse one or more properties of each cycle of the one or more wave cycles (106) between zero voltage crossing points to determine value of one or more properties of each cycle of the one or more wave cycles (106. After processing the one or more modulated sinusoidal carrier waves with zero side bands by the processing module (1156) are received by the recovery module (1158) and modulating signals are recovered. The recovered signals from the one or more modulated sinusoidal carrier waves with zero side bands are then received by the output driver (1160). At step 1110, the one or more output analog or digital signals are provided by the output driver (1160) to form one or more output signals.

Digital Generator Amplitude

Figure 3:
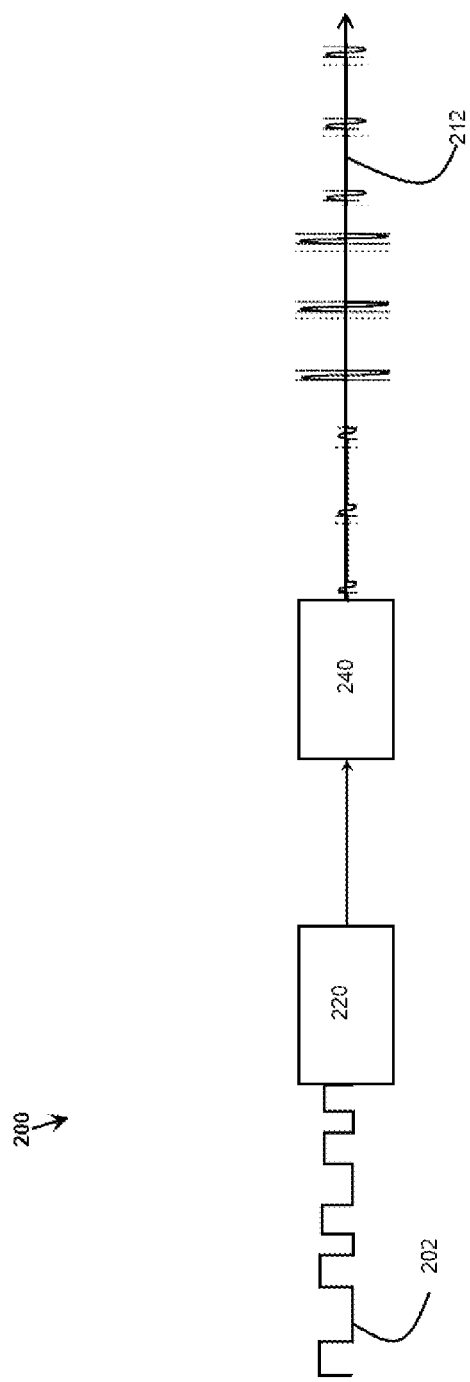
FIG. 3 illustrates a system to receive digital modulating signal and generate modulated sinusoidal carrier wave with zero side bands, in accordance with an embodiment of the present invention with predefined amplitude property.

In accordance with an embodiment of the present invention, the modulating signals are digital modulating signals (202). FIG. 3 illustrates a system (200), to receive digital modulating signals and generate modulated sinusoidal carrier waves with zero side bands (212), in accordance with an embodiment of the present invention by controlling amplitude property of the carrier wave cycles (104) by the one or more digital modulating signals received by a digital signal receiving module (220). The digital signal receiving module (220) is connected to a digital carrier wave module (240). The digital carrier wave module (240) is configured to generate modulated sinusoidal carrier waves with zero side bands (212). The modulated sinusoidal carrier waves with zero side bands (212) may include, but not limited to, one or more wave cycles (104). The one or more wave cycles (106) may be, but not limited to, one or more pure sine wave cycles (107) or one or more zero voltage cycles (110). The one or more wave cycles (106) may be, but not limited to, half wave cycles (108) or full wave cycles (107). One or more properties of each sine cycle (106) are defined only at the starting zero crossing point and one or more wave cycles (106) are configured to start at but not limited to the zero voltage crossing point and end at the consecutive zero voltage crossing point on completion of the full sine wave cycle In accordance with an embodiment of the present invention, the digital signal receiving module (220) is configured to receive the one or more AES3 digital audio signals, as modulating signals. FIG. 4 illustrates the digital signal receiving module (220) which comprises, may be, but not limited to, a Digital Receiver (222) an Edge Detector (224) and an Edge processor (226). The Digital Receiver (222) receives the one or more digital modulating signals. The Digital Receiver (222) is connected to an Edge Detector (224) which converts +ve and −ve going transitions from input to short pulses as shown in FIG. 6A4. The Edge Detector (224) is further connected to the Edge processor (226).

FIG. 5 illustrates the digital carrier wave module (240). The digital carrier wave module (240) comprises a triggered 0° to 360° cycle generator (242) which receives transition information from edge processor (226) shown in wave form FIG. 6A6. The triggered 0° to 360° cycle generator (242) is connected to a reference oscillator (244) for timing information. The triggered 0° to 360° cycle generator (242) is further connected to a Ground centred square wave generator (246) to ensure carrier cycle starting is at zero crossing point. The Ground centred square wave generator (246) is connected to a Square to sine wave converter (248) which generates modulated sinusoidal carrier wave with zero side bands. The Square to sine wave converter (248) is connected to Carrier only pass filter (249). FIG. 6A shows the typical wave forms for an embodiment.

Analog Generator Amplitude

Figure 7:
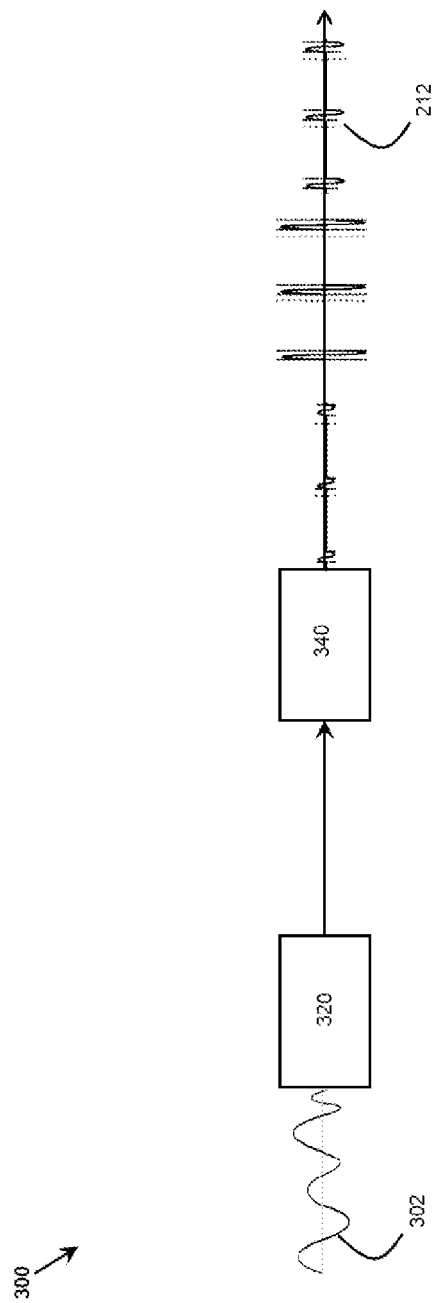
FIG. 7 illustrates a system to receive analog modulating signal and generate modulated sinusoidal carrier wave with zero side bands from analog modulating signals, in accordance with an embodiment of the present invention with predefined amplitude property.

In accordance with an embodiment of the present invention, FIG. 7 illustrates a system to receive analog modulating signal (302) and generate modulated sinusoidal carrier wave with zero side bands. The system (300) with control of amplitude property of carrier waves comprises defining amplitude vector of each sine wave cycle at the starting zero crossing point of the sine wave cycle (106) in accordance with one or more properties of one or more analog modulating signals. The analog signal receiving module is connected to an analog carrier wave module (340) configured to generate modulated sinusoidal carrier waves with zero side bands. The modulated sinusoidal carrier waves with zero side bands (212) may include, but not limited to, one or more wave cycles (106), one or more zero voltage cycles (110 one or more half wave cycles (108) or full wave cycles (107). The one or more sine wave cycles (106) are configured to start at but not limited to the zero-voltage crossing point and end at the consecutive zero voltage crossing point on completion of full cycle.

In accordance with an embodiment of the present invention, FIG. 8 illustrates the analog signal receiving module (320) comprising a reference oscillator (328) connected to a carrier zero crossing detector (326). The carrier zero crossing detector (326) is connected to a sample clock generator (324) is connected to a sample and hold (322) which samples modulating signal at zero crossing point of carrier frequency.

Figure 9:
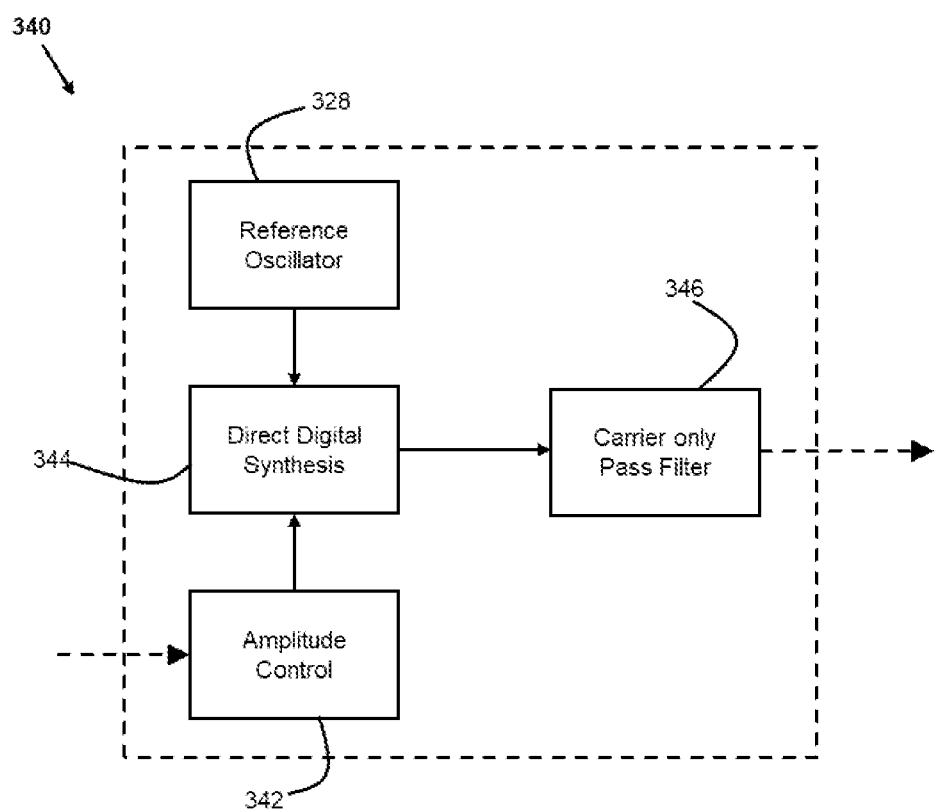
FIG. 9 illustrates an analog carrier wave module generating modulated sinusoidal carrier wave with zero side bands from analog modulating signal, in accordance with an embodiment of the present invention with predefined amplitude property.

In accordance with an embodiment of the present invention, the analog signal receiving module (320) is further connected to the analog carrier wave module (340) via the sample and hold (322). FIG. 9 illustrates analog carrier wave module (340). The analog carrier wave module (340) comprises an amplitude control (342). The amplitude control (342) may be connected to a direct digital synthesis (344). The one or more wave cycles generated by direct digital synthesis (344) having their one or more properties defined by the control module at the zero crossing point, at start of each sine cycle and are configured to start at but not limited to the zero voltage crossing point and end at but not limited to the consecutive zero voltage crossing point on completion of full cycle. The direct digital synthesis (344) is further connected to a reference oscillator (328). The direct digital synthesis (344) is further connected to a Carrier only pass filter (346). Output of the carrier pass filter generates the modulated sinusoidal carrier waves with zero side bands.

Digital Receiver Amplitude

Figure 10:
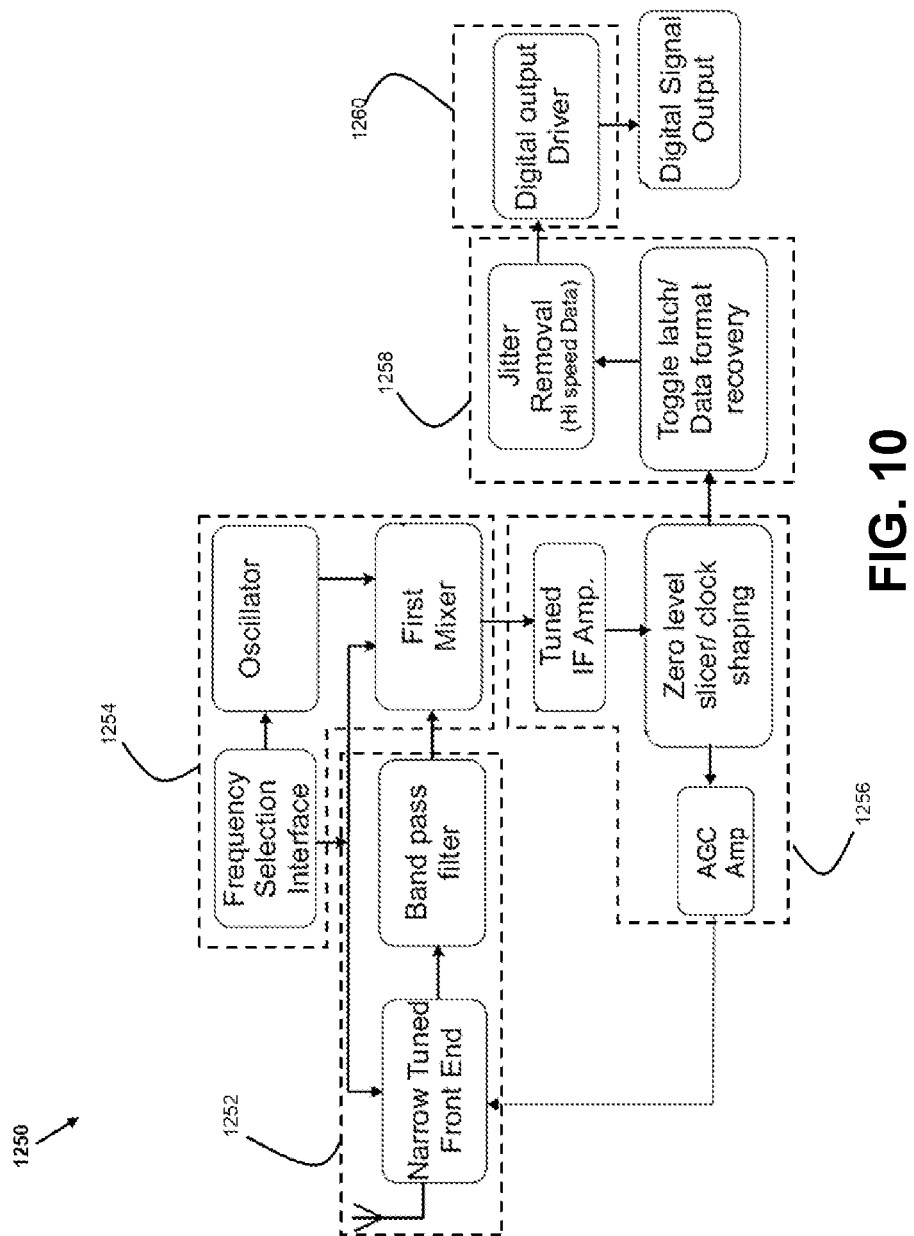
FIG. 10 illustrates an arrangement of devices inside the system for receiving modulated sinusoidal carrier wave with zero side bands to convert it into digital signals, in accordance with an embodiment of the present invention with predefined amplitude property.

FIG. 10 illustrates the arrangement of devices inside the system for receiving modulated sinusoidal carrier waves with zero side bands (212) generated with predefined amplitude and to convert it into digital signals, in accordance with an embodiment of the present invention. The system (1250) comprises a front end (1252). The front end (1252) comprises may be, but not limited to, a narrow tuned front end (1252) and band pass filter optimised to receiving modulated sinusoidal carrier waves with zero side bands. The front end (1252) may be connected to a stabilizing module (1254) comprising may be, but not limited to, frequency selection interface, oscillator and mixing stage. The stabilizing module (1254) is connected to a processing module (1256). The processing module (1256) comprises may be, but not limited to, tuned rf amplifier, tuned IF amplifier, zero level slicer/clock shaping, AGC amplifier, gain control and detector. The processing module (1256) is connected to a recovery module (1258). The recovery module (1258) comprises may be, but not limited to, toggle latch/data format recovery and Jitter removal. The recovery module (1258) is connected to an output driver (1260).

Figure 11:
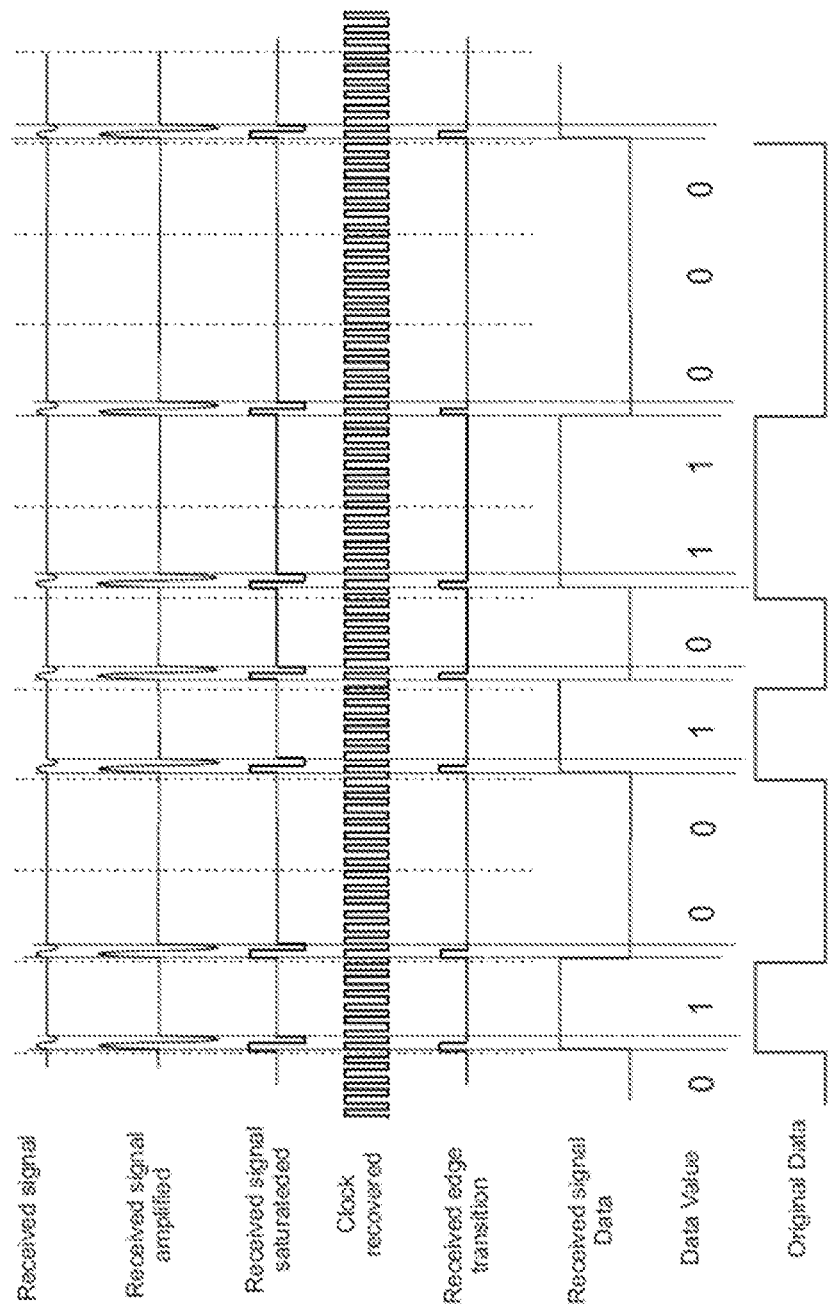
FIG. 11 illustrates the resultant wave form of reception of modulated sinusoidal carrier wave with zero side bands, in accordance with an embodiment of the present invention with predefined amplitude property.

FIG. 11A illustrates the wave forms during conversion of received modulated sinusoidal carrier waves with zero side bands (212) into digital signal.

Analog Receiver Amplitude

Figure 12:
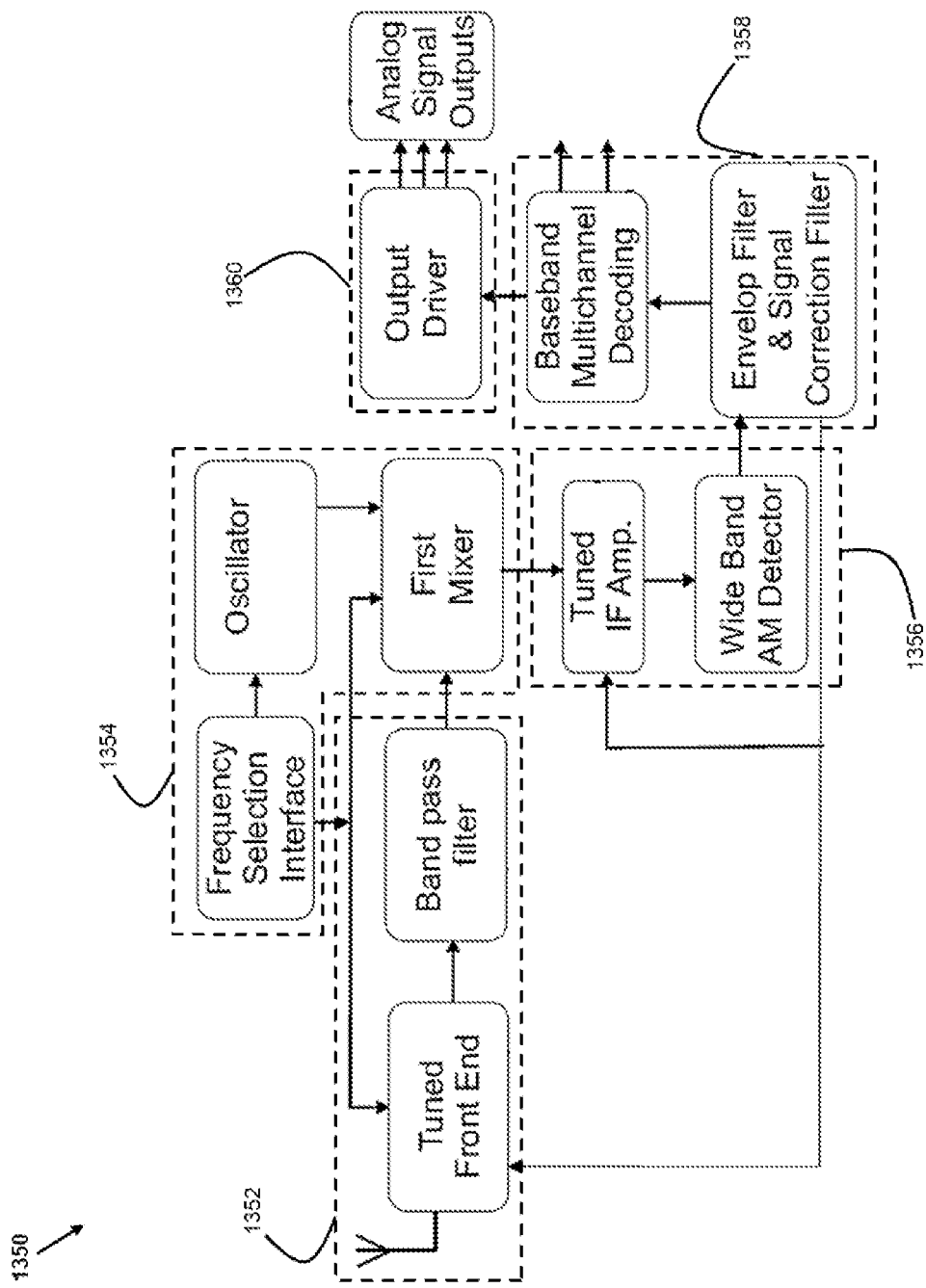
FIG. 12 illustrates the arrangement of devices inside the system for receiving modulated sinusoidal carrier wave with zero side bands to convert it into analog signals, in accordance with an embodiment of the present invention with predefined amplitude property.

FIG. 12 illustrates the arrangement of devices inside the receiving system (1350) optimised for receiving modulated sinusoidal carrier waves with zero side bands (212) with predefined amplitude property, and to convert it into analog signals, in accordance with an embodiment of the present invention. The system comprises a front end (1352) comprising may be, but not limited to, a narrow tuned front end (1352) and band pass filter optimised for receiving modulated sinusoidal carrier waves with zero side bands. The front end (1352) is connected to a stabilizing module (1354). The stabilizing module (1354) comprises may be, but not limited to, tuned rf amplifier frequency selection interface, oscillator and mixer is connected to a processing module (1356). The processing module (1356) comprises may be, but not limited to, tuned rf amplifier, tuned IF amplifier, wide band AM Detector optimised for receiving modulated sinusoidal carrier waves with zero side bands. The processing module (1356) is connected to a recovery module (1358). The recovery module (1358) comprises may be, but not limited to, envelop filter & signal correction filter and baseband multichannel decoding optimised for receiving modulated sinusoidal carrier waves with zero side bands. The recovery module (1358) is connected to an output driver (1360).

The difference in invented method and system for frequency being variable property instead of Amplitude variable, as explained above is that on every new sine wave carrier cycle start, its frequency changes to pre-defined carrier frequency in steps, maintaining sine wave function for each new frequency cycle. Because the carrier frequencies are pre-defined within allocated range depending on the application, there are no side bands generated. In embodiments of the present invention with frequency parameter being variable, frequency of each cycle changes in steps from one frequency to next frequency keeping each complete wave cycle follow sine function accurately.

Figure 13:
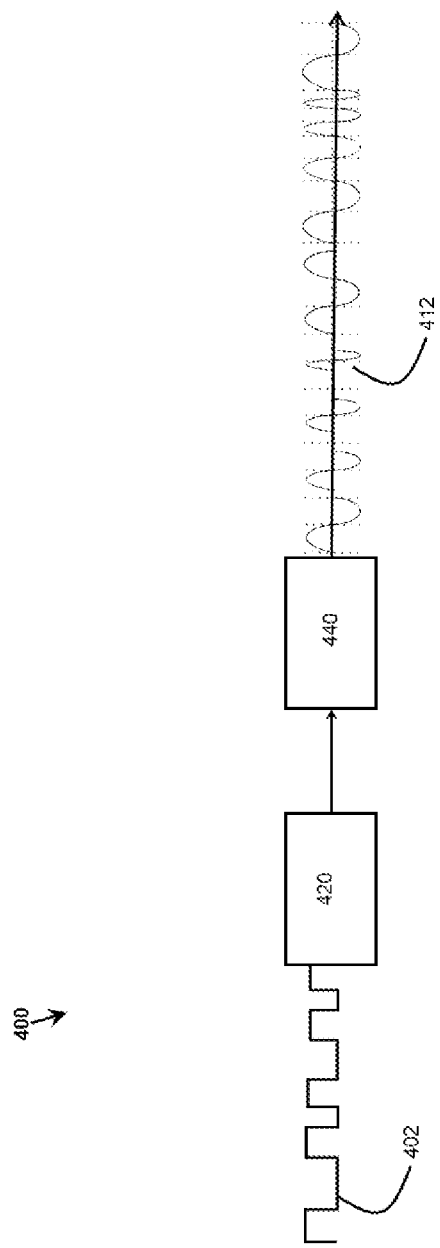
FIG. 13 illustrates a system to receive digital modulating signal and generate modulated sinusoidal carrier wave with zero side bands, in accordance with an embodiment of the present invention with predefined frequency property.
Figure 14:
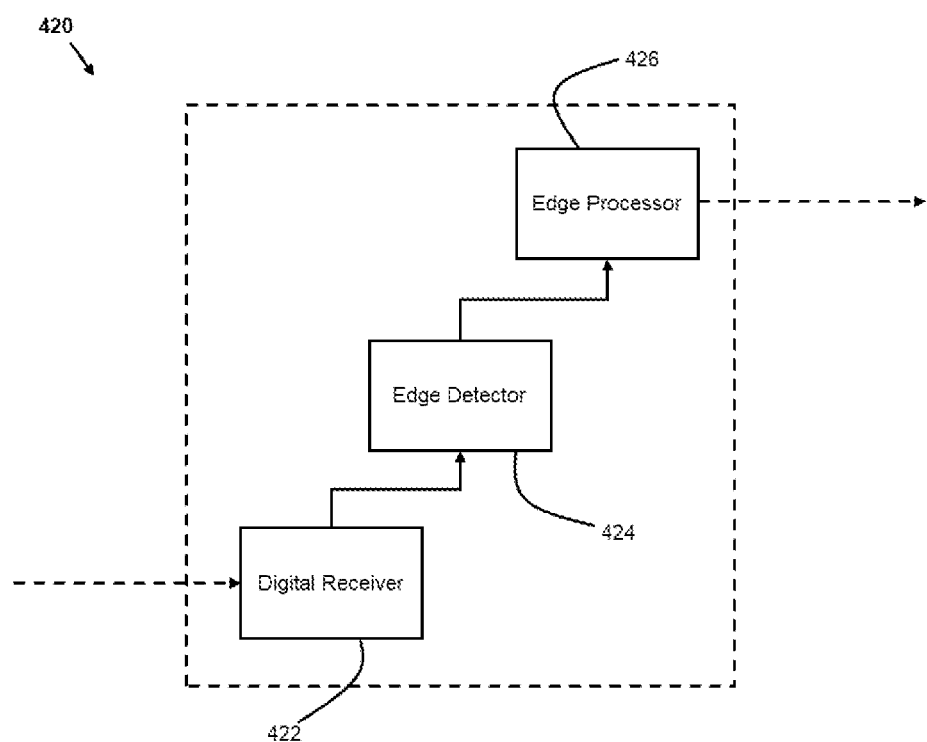
FIG. 14 illustrates a digital signal receiving module to receive digital modulating signals, in accordance with an embodiment of the present invention with predefined frequency property.

In accordance with an embodiment of the present invention, the modulating signals are digital modulating signals (402) FIG. 13 illustrates a system to receive digital modulating signals (402) and generate modulated sinusoidal carrier wave with zero side bands (412), by controlling frequency property of the carrier wave cycles (106). The one or more digital modulating signals (402) received by a digital signal receiving module (420) are connected to a digital carrier wave module (440). The digital carrier wave module (440) is configured to generate modulated sinusoidal carrier wave with zero side bands (412) which may include, but not limited to, one or more wave cycles (106), one or more zero voltage cycles (110), one or more half wave cycles (108) or full wave cycles (107). The one or more properties of each sine cycle (106) are defined at the starting zero crossing point and one or more sine wave cycles (106) are configured to start at but not limited to the zero voltage crossing point and end at but not limited to the consecutive zero voltage crossing point after completing full sine wave cycle. FIG. 14 illustrates a digital signal receiving module (420) to receive digital modulating signals (402), comprising may be, but not limited to, a digital receiver (422), an edge detector (424) and an edge processor (426). The digital receiver (422) receives the one or more digital modulating signals (402) and is connected to an edge detector (424) which is further connected to the edge processor (426).

Figure 15:
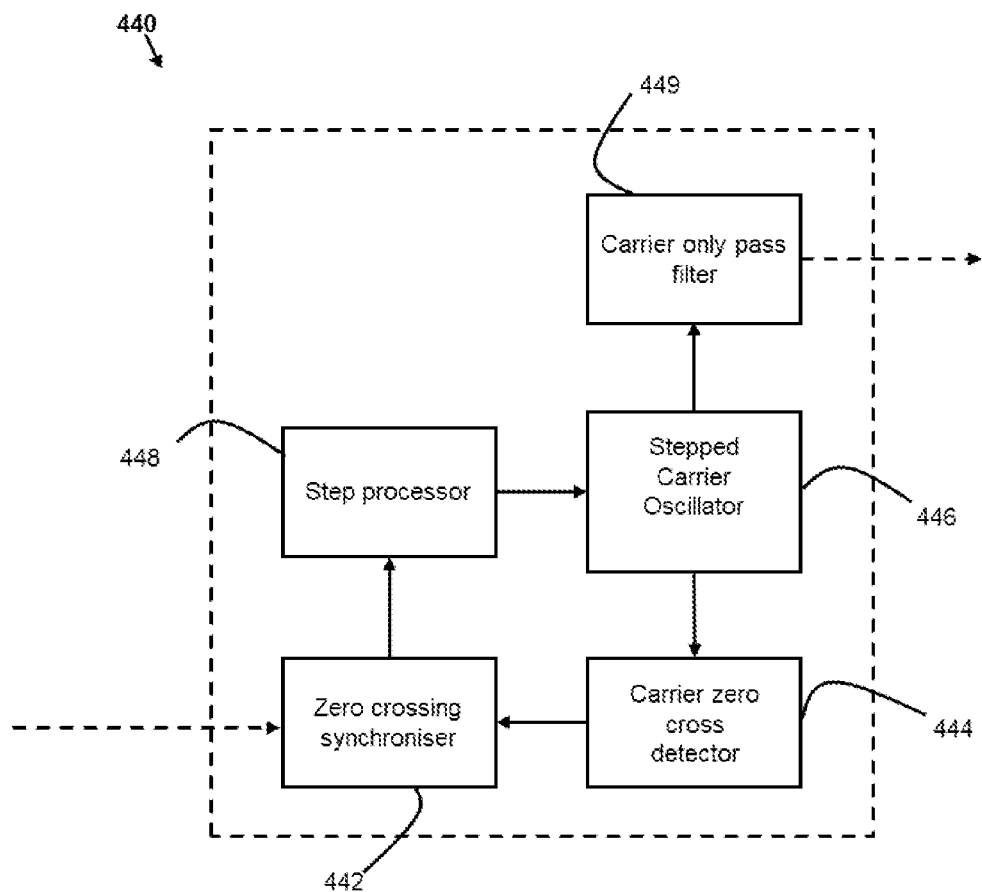
FIG. 15 illustrates digital carrier wave module for generating modulated sinusoidal carrier wave with zero side bands from digital modulating signal, in accordance with an embodiment of the present invention with predefined frequency property.

FIG. 15 illustrates the digital carrier wave module (440) comprising of a Zero crossing synchroniser (442), Step processor (448) which provide information to stepped carrier oscillator (446). The Step processor (448) is further connected to a stepped carrier oscillator (446) configured to generate pre-defined carrier frequency cycles starting each cycle only at zero crossing point and ending it at subsequent zero crossing point. The Zero crossing synchroniser (442) is further connected to a carrier zero cross detector (444) which is further connected to the stepped carrier oscillator (446). The stepped carrier oscillator (446) is further connected to carrier only pass filter (449).

Figure 16:
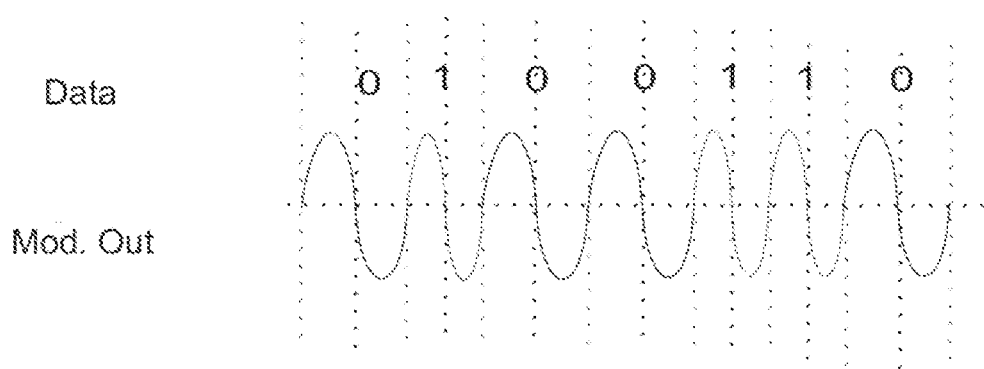
FIG. 16 illustrates the resultant wave form generation, in accordance with an embodiment of the present invention with predefined frequency property.

FIG. 16 illustrates a wave form generated from the above-mentioned system.

Analog Generator [System] Frequency

Figure 17:
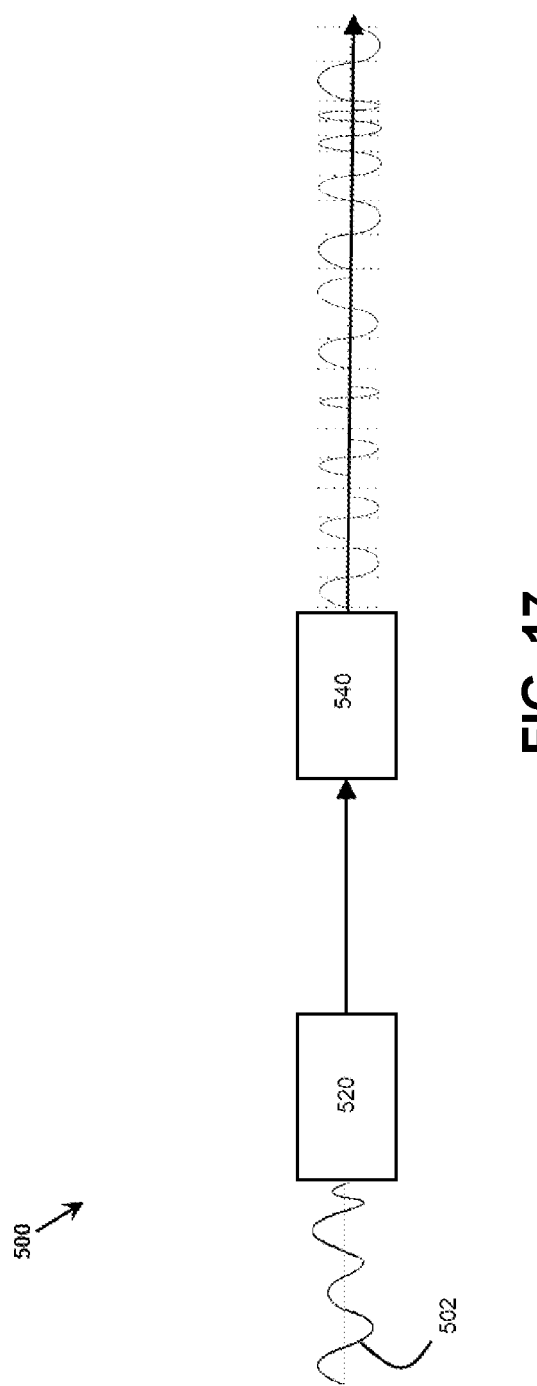
FIG. 17 illustrates a system to receive analog modulating signal and generate modulated sinusoidal carrier wave with zero side bands from analog modulating signals, in accordance with an embodiment of the present invention with predefined frequency property.

In accordance with an embodiment of the present invention, FIG. 17 illustrates a system to receive one or more analog modulating signals (502) and generate modulated sinusoidal carrier waves with zero side bands (412). The system comprises one or more analog modulating signals (502) generating modulated sinusoidal carrier waves with zero side bands by controlling frequency property of the carrier wave cycles (106) keeping amplitude and phase constant. The analog signal receiving module (520) is connected to an analog carrier wave module (540) configured to generate modulated sinusoidal carrier wave with zero side bands. The modulated sinusoidal carrier waves with zero side bands (112) may include, but not limited to, one or more wave cycles (106) or one or more zero voltage cycles (110) or half wave cycles (108) or full wave cycles (107). The one or more properties of each sine cycle (106) are defined at the starting zero crossing point and are configured to start at but not limited to the zero voltage crossing point and end at but not limited to the consecutive zero voltage crossing point after completing the full sine wave cycle.

Figure 18:
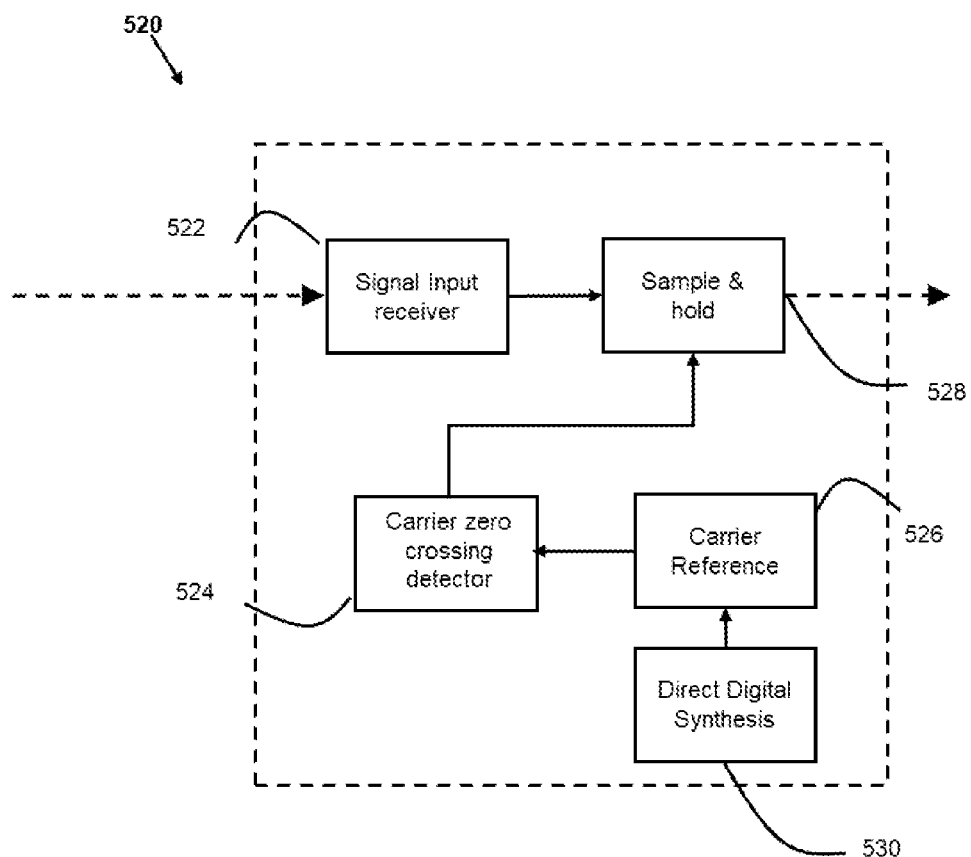
FIG. 18 illustrates an analog signal receiving module to receive analog modulating signals, in accordance with an embodiment of the present invention with predefined frequency property.

FIG. 18 illustrates the analog signal receiving module (520) comprising of a signal input module connected to a sample and hold (528) which is further connected with a carrier zero crossing detector (524). The carrier zero crossing detector (524) is connected with carrier reference generator (526) which is further connected with a direct digital synthesis (530) configured to generate modulated sinusoidal carrier waves with zero side bands.

Figure 19:
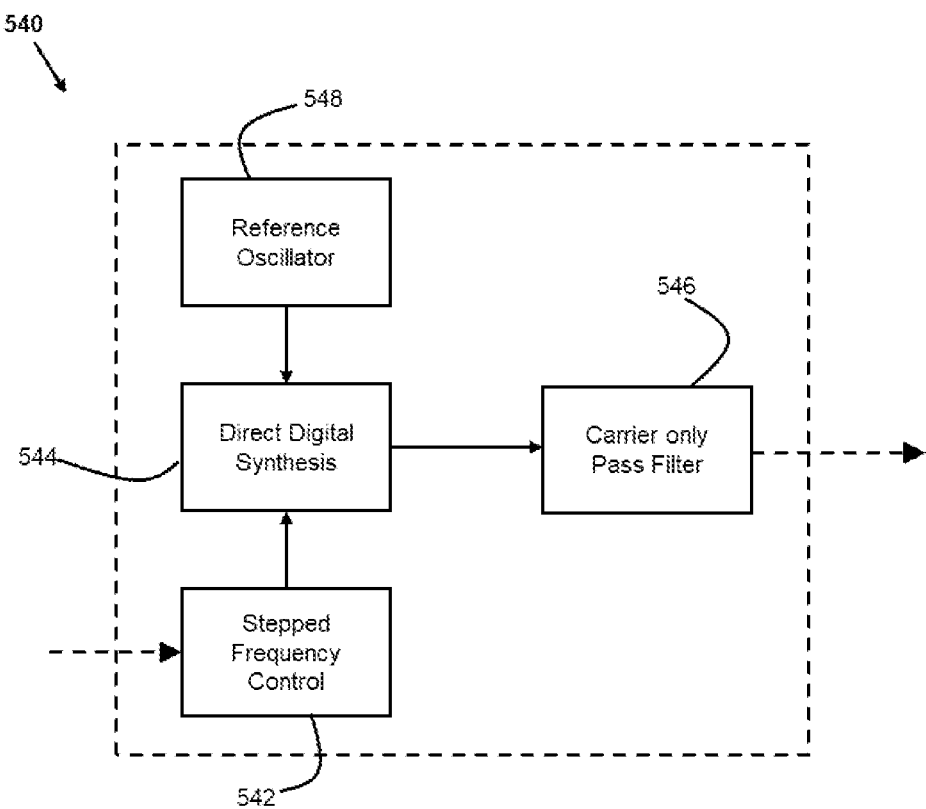
FIG. 19 illustrates an analog carrier wave module generating modulated sinusoidal carrier wave with zero side bands from analog modulating signal, in accordance with an embodiment of the present invention with predefined frequency property.
Figure 20:
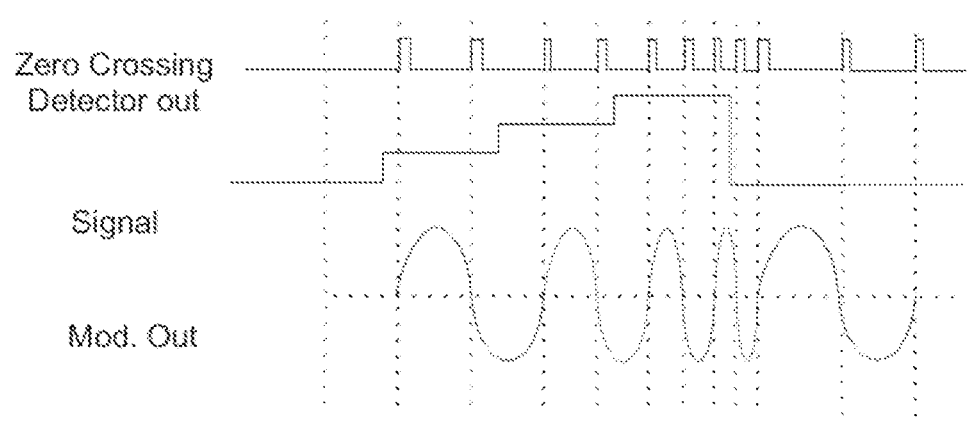
FIG. 20. illustrates the resultant wave form generation, in accordance with an embodiment of the present invention with predefined frequency property. Here analog signal is shown in steps for easy understanding.
Figure 21:
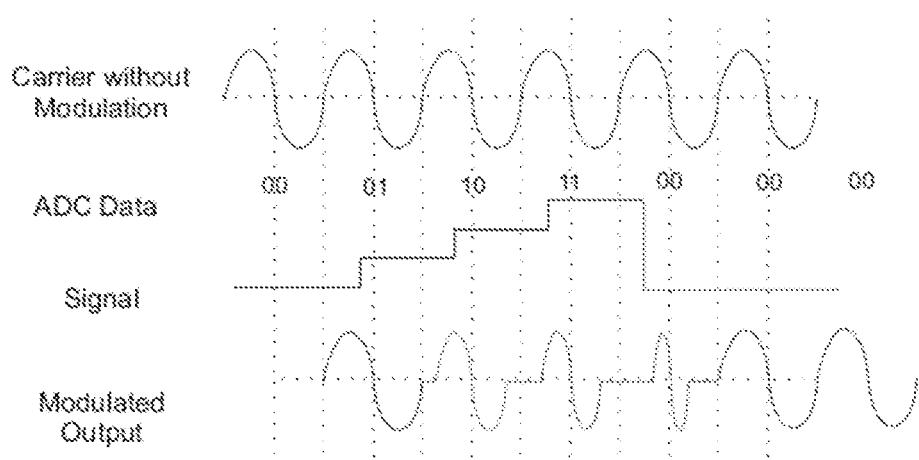
FIG. 21. illustrates the resultant wave form generation with insertion of zero cycles, in accordance with an embodiment of the present invention with predefined frequency property. Here analog signal is shown in steps for easy understanding.

In accordance with an embodiment of the present invention, FIG. 19 illustrates an analog carrier wave module (540). The analog carrier wave module (540) comprises a Stepped Frequency Control (542) connected with the Direct Digital Synthesis (544). The Direct Digital Synthesis (544) is connected to a Reference Oscillator (548). The Direct Digital Synthesis (544) is further connected to a carrier only pass filter (546). Resulting modulated sinusoidal carrier waves with zero side bands (412) generated without zero voltage cycles are illustrated in FIG. 20 and FIG. 21 illustrates output using zero voltage cycles.

Digital Receiver [System] Frequency

Figure 22:
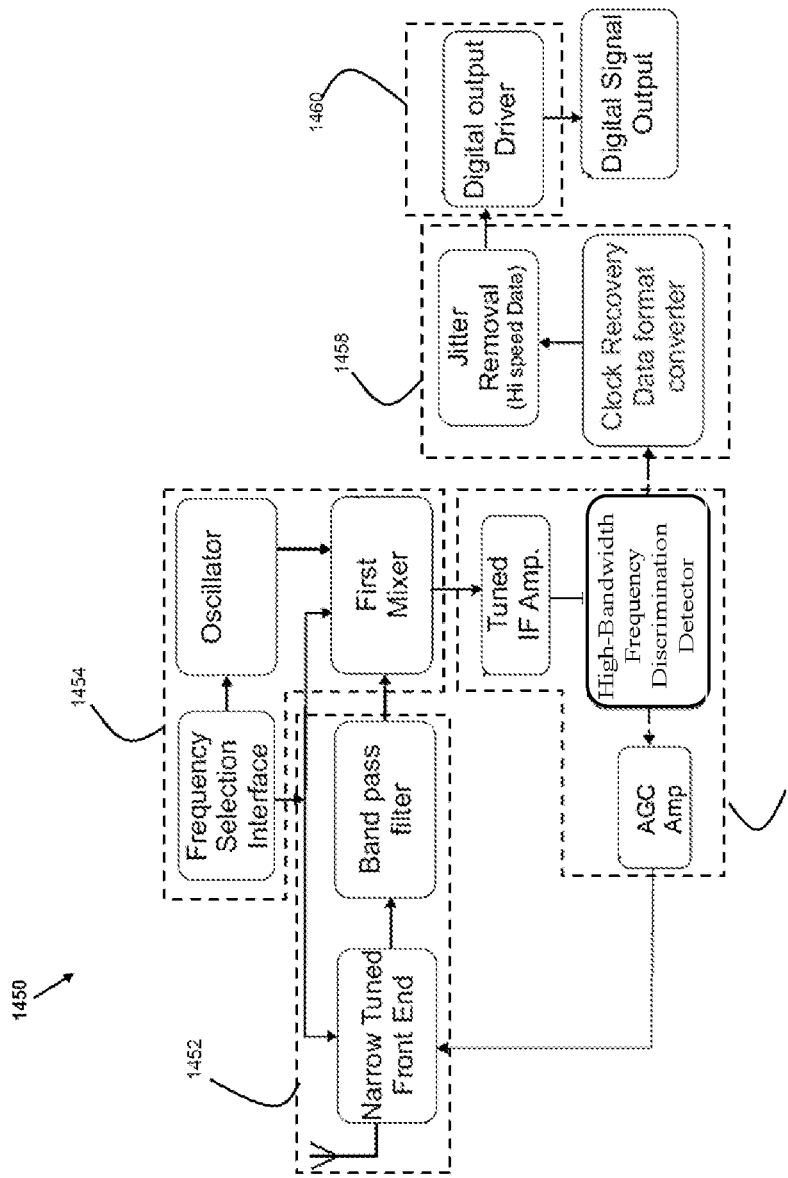
FIG. 22. illustrates an arrangement of devices inside the system for receiving modulated sinusoidal carrier wave with zero side bands to convert it into digital signals, in accordance with an embodiment of the present invention with predefined frequency property.

FIG. 22 illustrates an arrangement of devices inside the receiving system for receiving modulated sinusoidal carrier waves with zero side bands (412) with control of frequency parameters, to recover digital signals, in accordance with an embodiment of the present invention. The receiving system comprises a front end (1452) comprising may be, but not limited to, a tuned front end (1452) and band pass filter. The front end (1452) is connected to a stabilizing module (1454) comprising of may be, but not limited to, frequency selection interface, oscillator and mixer. The stabilizing module (1454) is connected to a processing module (1456) comprising of may be, but not limited to, tuned IF amplifier, High-Bandwidth frequency discriminator/detector, AGC amplifier and gain control. The processing module (1456) is connected to a recovery module (1458) which detect wide band modulating signals. The recovery module (1458) comprises may be, but not limited to, clock recovery, data format converter and Jitter removal and may further include processing to decode multichannel digital signals and connected to an output driver (1460).

Analog Receiver [System] Frequency

Figure 23:
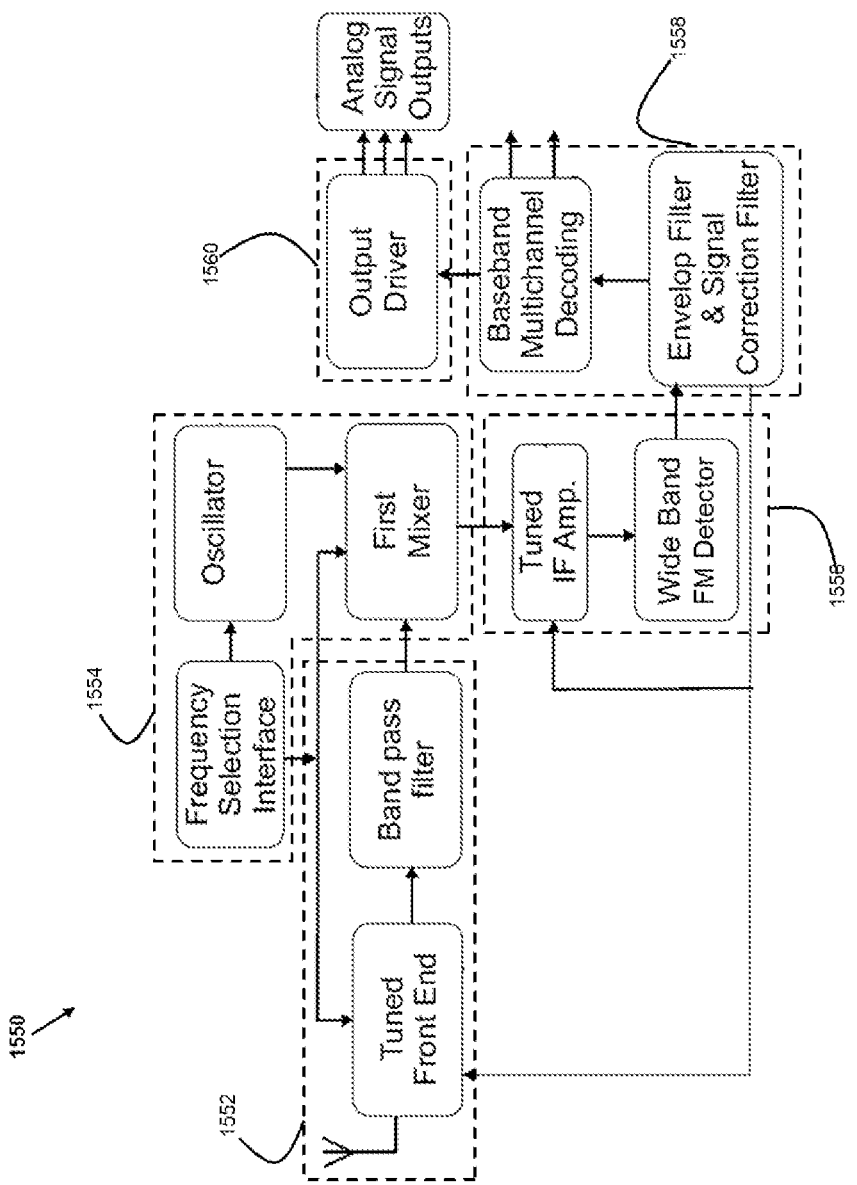
FIG. 23. illustrates the arrangement of devices inside the system for receiving modulated sinusoidal carrier wave with zero side bands to convert it into analog signals, in accordance with an embodiment of the present invention with predefined frequency property.

FIG. 23 illustrates the arrangement of devices inside the receiving system for receiving modulated sinusoidal carrier waves with zero side bands (412) with control of frequency parameters, to convert it into analog signals, in accordance with an embodiment of the present invention. The system comprises a front end (1552) comprising of may be, but not limited to, tuned front end (1552) and band pass filter. The front end (1552) is connected to a stabilizing module (1554) comprising of may be, but not limited to, frequency selection interface, oscillator and mixer. The stabilizing module (1554) is connected to a processing module (1556) comprising of may be, but not limited to, tuned IF amplifier, wide band FM Detector. The processing module (1556) is connected to a recovery module (1558) comprising of may be, but not limited to, envelop filter & signal correction filter and baseband multichannel decoding. The recovery module (1558) is connected to an output driver (1560).

Figure 24:
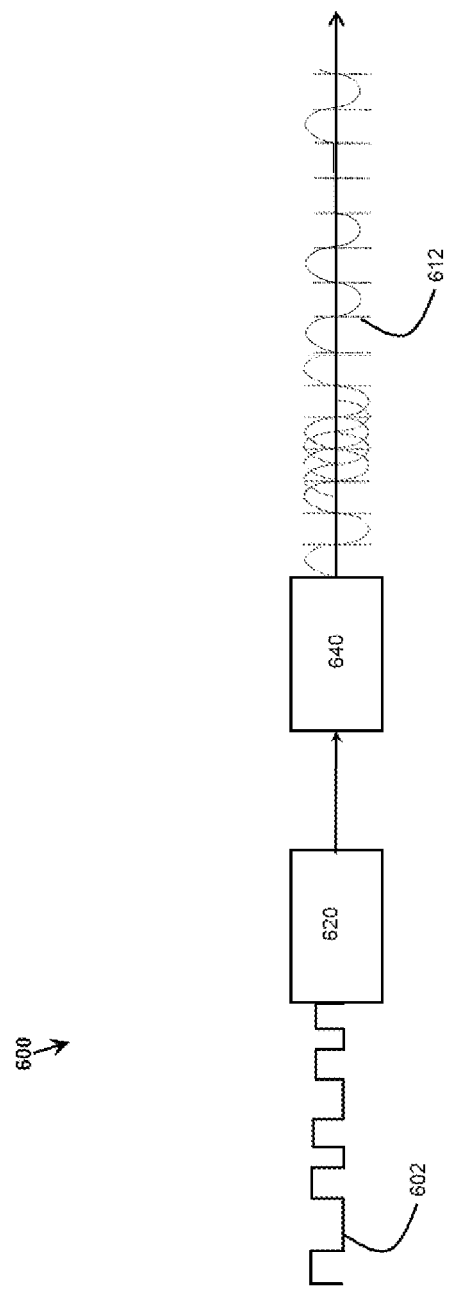
FIG. 24. illustrates a system to receive digital modulating signal and generate modulated sinusoidal carrier wave with zero side bands, in accordance with an embodiment of the present invention with predefined phase property.

In accordance with an embodiment of the present invention, FIG. 24 illustrates a system (600) for receiving one or more digital modulating signals (602) and by controlling phase properties generate the modulated sinusoidal carrier waves with zero side bands (612). The digital signal receiving module (620) is connected to a digital carrier wave module (640) configured to generate modulated sinusoidal carrier waves (612). The modulated sinusoidal carrier waves with zero side bands (612) may include, but not limited to, one or more sine wave cycles (106), one or more zero voltage cycles (110) or one or more reference cycles. The one or more sine wave cycles (106) may be, but not limited to, half wave cycles (108) or full wave cycles (107).

Digital Generator [System] Phase

Figure 25:
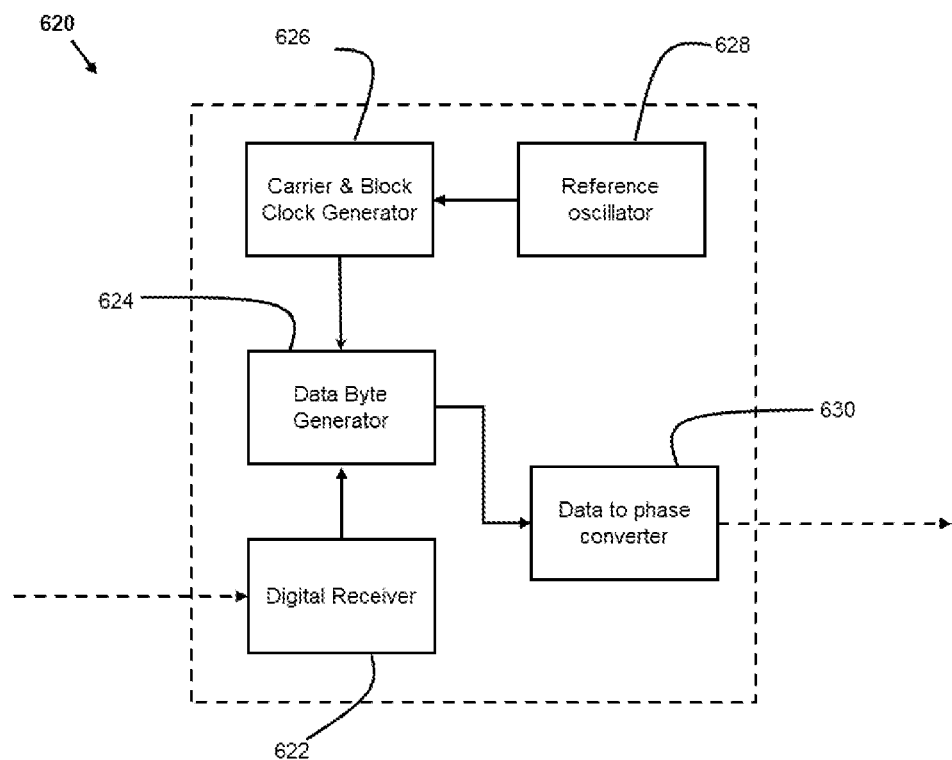
FIG. 25. illustrates a digital signal receiving module to receive digital modulating signals, in accordance with an embodiment of the present invention with predefined phase property.

In accordance with an embodiment of the present invention, FIG. 25 illustrates the digital signal receiving module (620 configured to receive the one or more digital modulating signals (602)). The digital receiver (622) is connected to Data Byte Generator (624) further connected with the Carrier & Block Clock Generator (626). The Carrier & Block Clock Generator (626) is connected with the Reference oscillator (628). The Data Byte Generator (624) is further connected with the Data to phase converter (630).

Figure 26:
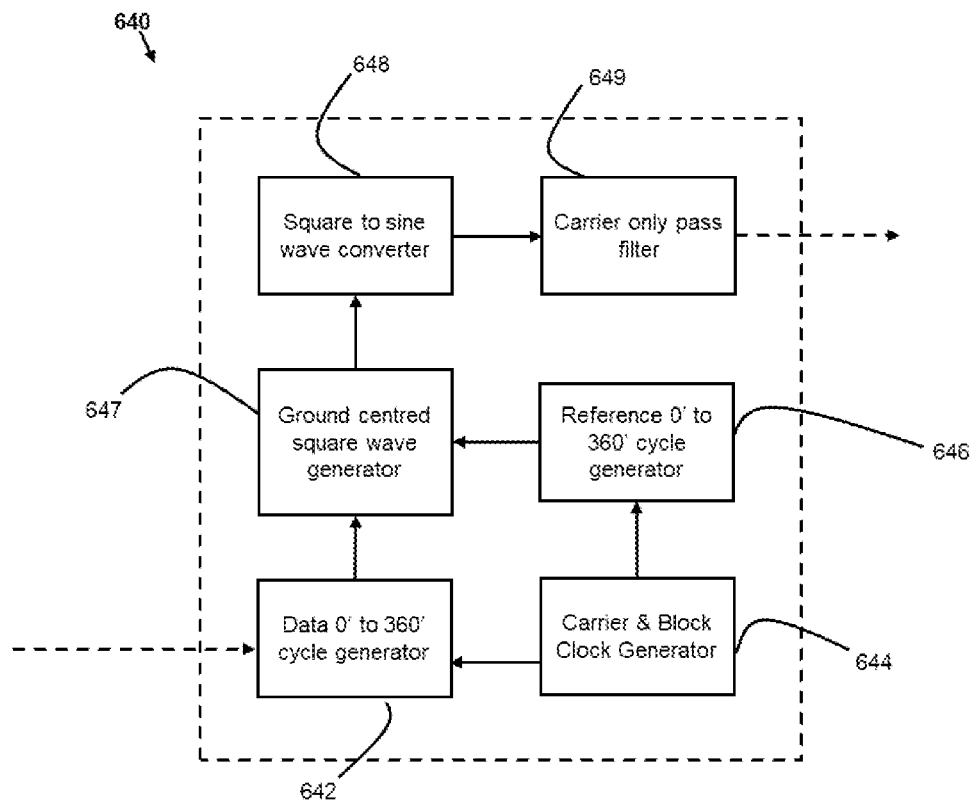
FIG. 26. illustrates digital carrier wave module for generating modulated sinusoidal carrier wave with zero side bands from digital modulating signal, in accordance with an embodiment of the present invention with predefined phase property.
Figure 27:
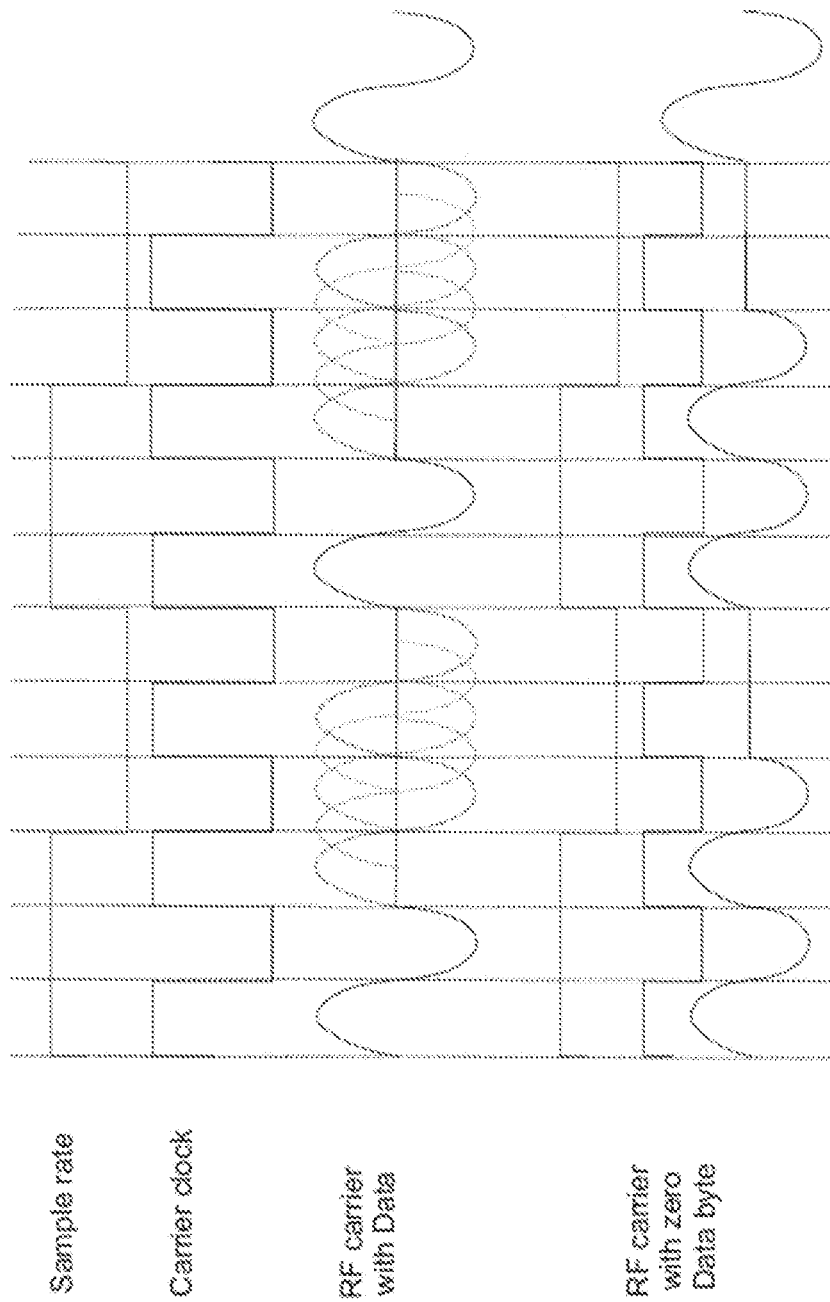
FIG. 27. illustrates the resultant wave form generation, in accordance with an embodiment of the present invention with predefined phase property. The first sine cycle of carrier is reference cycle and then dotted cycles are showing data as phase shift at zero crossing of the cycle.

In accordance with an embodiment of the present invention, FIG. 26 illustrates the digital carrier wave module (640). The digital carrier wave module comprises a Data carrying 0° to 360° cycle generator (642) is connected with a ground centred square wave generator (647). The ground centred square wave generator (647) is connected with a square to sine wave converter (648) which is connected to carrier only pass filter (649). The Data 0° to 360° cycle generator (642) is further connected with the Carrier & Block Clock Generator (644) which is further connected with a reference 0° to 360° cycle generator (646). The reference 0° to 360° cycle generator (646) is also connected with the Ground centred square wave generator (647). FIG. 27 illustrates prominent wave forms to illustrate the generation of phase modulated sinusoidal carrier waves with zero side bands (612).

Analog Generator [System] Phase

Figure 28:
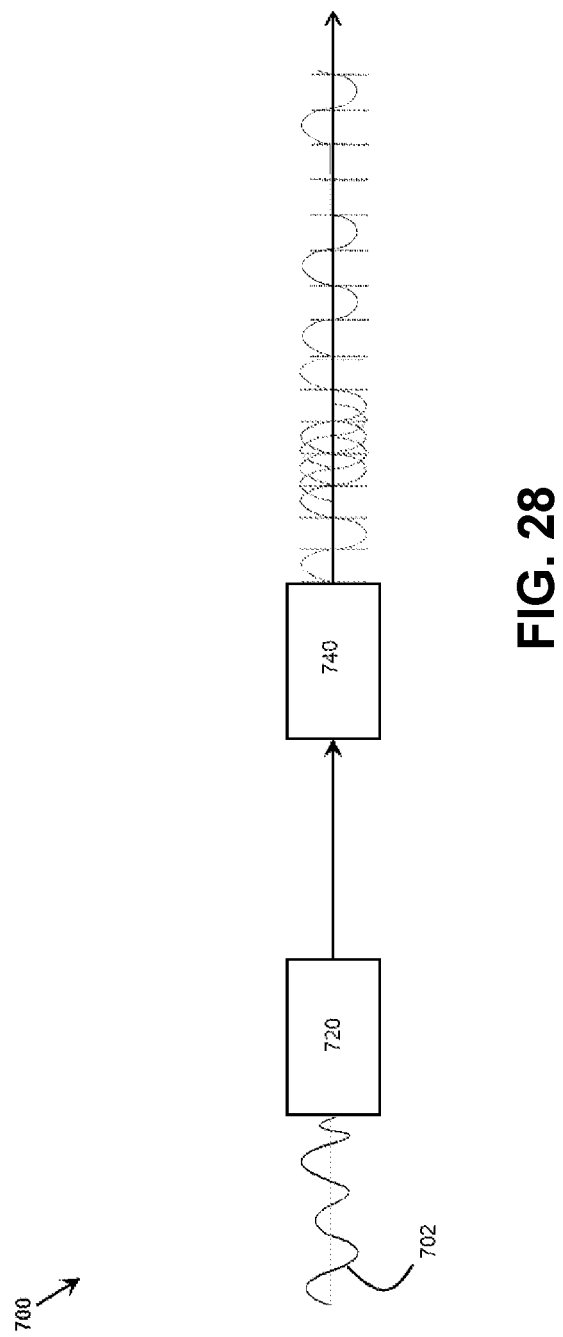
FIG. 28 illustrates a system to receive analog modulating signal and generate modulated sinusoidal carrier wave with zero side bands from analog modulating signals, in accordance with an embodiment of the present invention with predefined phase property.

In accordance with an embodiment of the present invention, FIG. 28 illustrates a system (700) receiving analog modulating signals (702) and is controlling phase properties to generate the modulated sinusoidal carrier waves (612). The one or more analog modulating signals (702) received by an analog signal receiving module (720) are connected to an analog carrier wave module (740) configured to generate modulated sinusoidal carrier waves (612) which may include, but not limited to, one or more wave cycles (106) or one or more zero voltage cycles (110) or one or more reference cycle or one or more half wave cycles (108) or full wave cycles (107).

Figure 29:
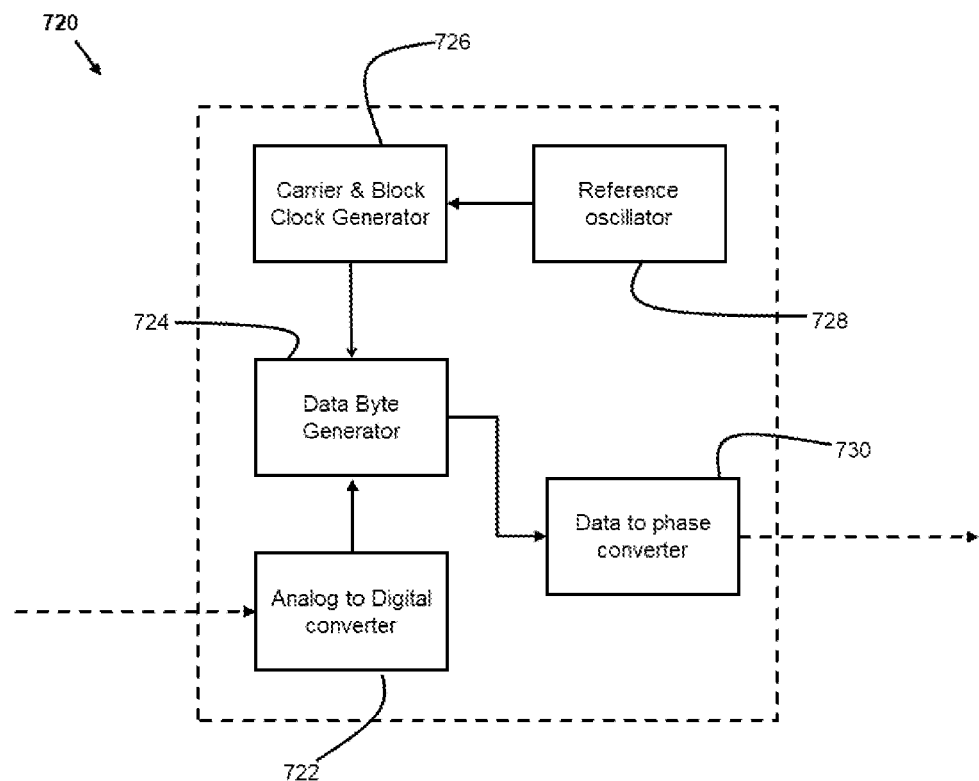
FIG. 29 illustrates an analog signal receiving module to receive analog modulating signals, in accordance with an embodiment of the present invention with predefined phase property.

In accordance with an embodiment of the present invention, FIG. 29 illustrates the analog signal receiving module (720) configured to receive the one or more analog modulating signals (702). The analog signal receiving module (720) comprises may be, but not limited to, an Analog to Digital converter (722) a data byte generator (724) a Reference oscillator (728), a Data to phase converter (730) and a Carrier & Block Clock Generator (726). The analog receiver is connected with the Data Byte Generator (724) which is further connected with the Carrier clock & Block Clock Generator (726) and is further connected with the Reference oscillator (728). The Data Byte Generator (724) is further connected with the Data to phase converter (730).

Figure 30:
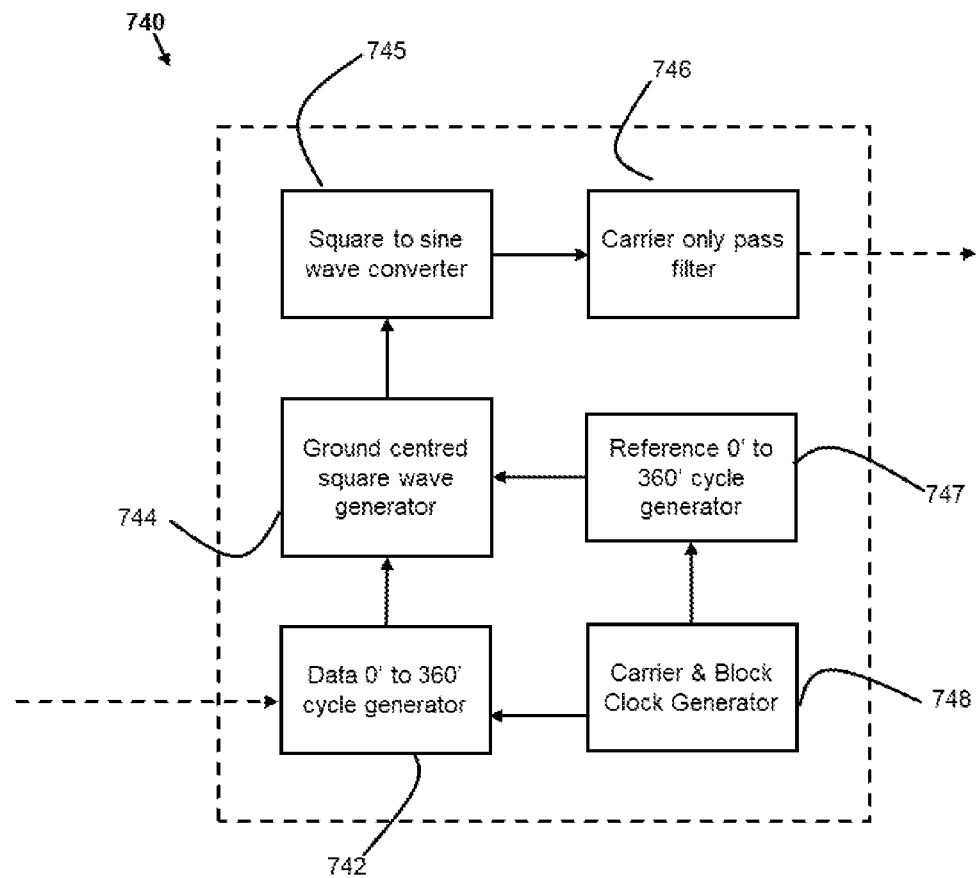
FIG. 30 illustrates an analog carrier wave module generating modulated sinusoidal carrier wave with zero side bands from analog modulating signal, in accordance with an embodiment of the present invention with predefined phase property.
Figure 31:
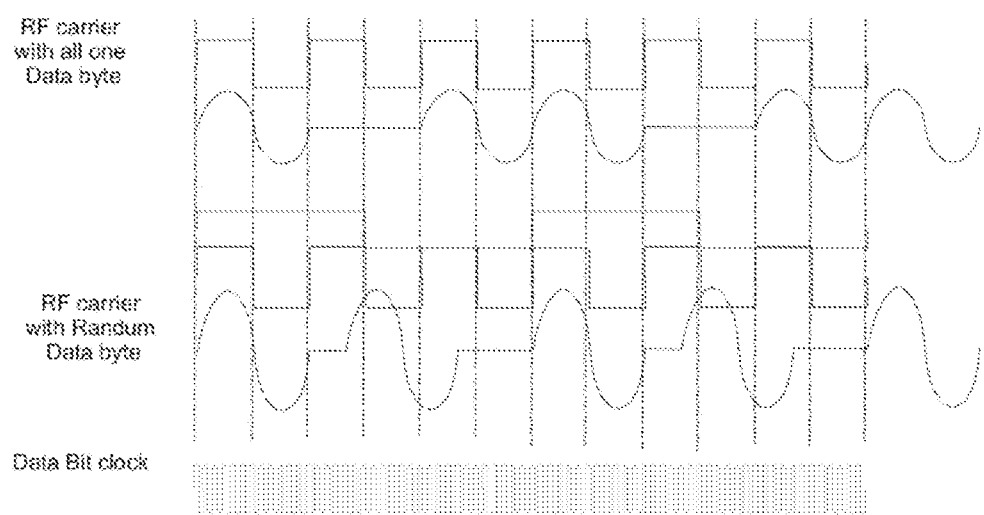
FIG. 31 illustrates the resultant wave form generation, in accordance with an embodiment of the present invention with predefined phase property.

In accordance with an embodiment of the present invention, the analog signal receiving module (720) is further connected to the analog carrier wave module (740) via the Data to phase converter (730). FIG. 30 illustrates the analog carrier wave module (740) comprising of a Data 0° to 360° cycle generator (742) with predefined phase. The Data 0° to 360° cycle generator (742) is connected with a ground centred square wave generator (744) which is connected with a square to sine wave converter (745) and to carrier only pass filter (746). The Data 0° to 360° cycle generator (742) is further connected with the Carrier & Block Clock Generator (748) which is further connected with a reference 0° to 360° cycle generator (747). The reference 0° to 360° cycle generator (747) is also connected with the Ground centred square wave generator (744). FIG. 31 illustrates some wave forms illustrating the phase controlled sinusoidal wave cycles (106) generation as per an embodiment of the present invention.

Digital Receiver [System] Phase

Figure 32:
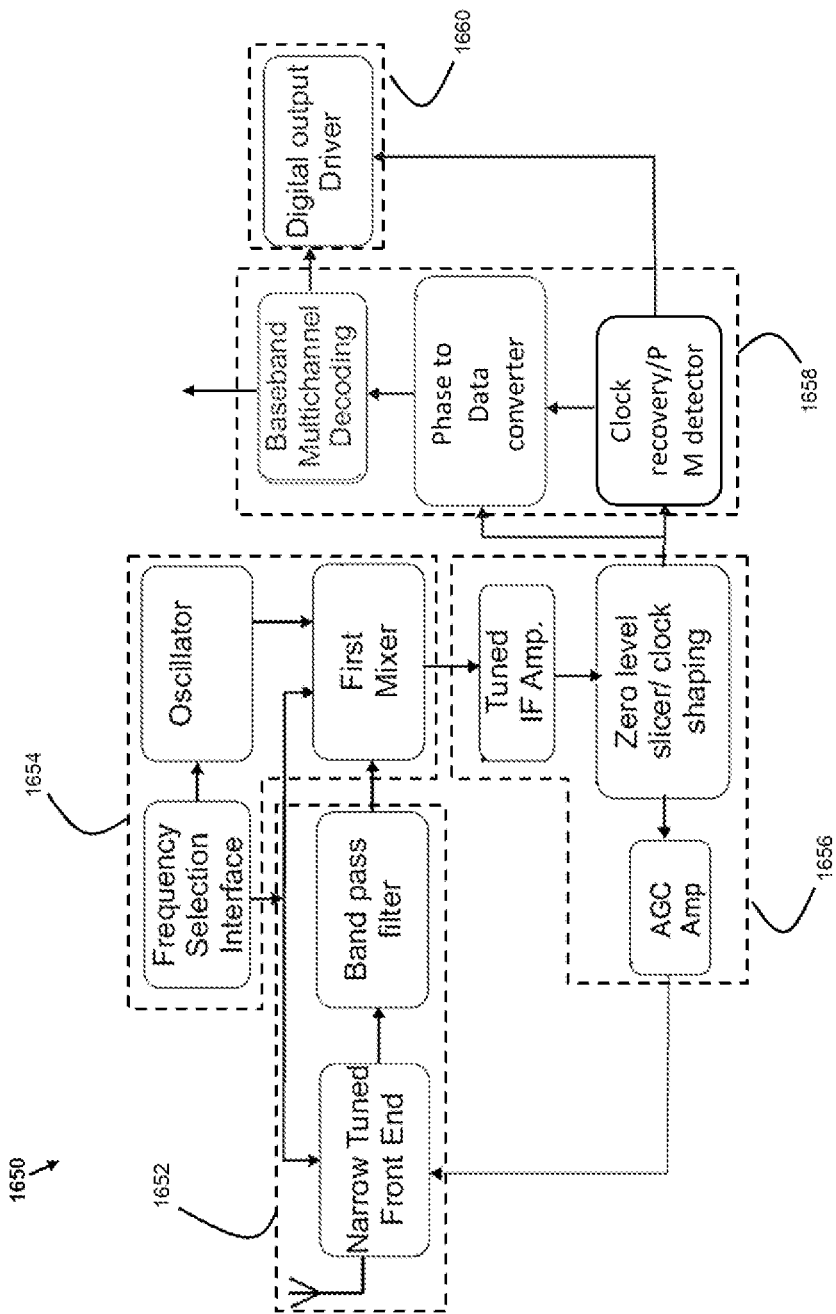
FIG. 32 illustrates an arrangement of devices inside the system for receiving modulated sinusoidal carrier wave with zero side bands to convert it into digital signals, in accordance with an embodiment of the present invention with predefined phase property.

FIG. 32 illustrates a system for receiving modulated sinusoidal carrier waves with zero side bands (612) to convert it into digital signals, in accordance with an embodiment of the present invention. The system comprises a front end (1652) comprising of may be, but not limited to, a narrow tuned front end (1652) and band pass filter connected to a stabilizing module (1654). The stabilizing module (1654) comprises may be, but not limited to, frequency selection interface, oscillator and first mixer and may have heterodyne process to convert sinusoidal waves in to upper or lower intermediate frequencies. The stabilizing module (1654) is connected to a processing module (1656) comprising of may be, but not limited to, tuned IF amplifier. The processing module (1656) is connected to a recovery module (1658) comprising of may be, but not limited to, clock recovery, wide band PM Detector, phase to data converter and baseband multichannel decoding. The recovery module (1658) is connected to an output driver (1660).

Analog Receiver System Phase

Figure 33:
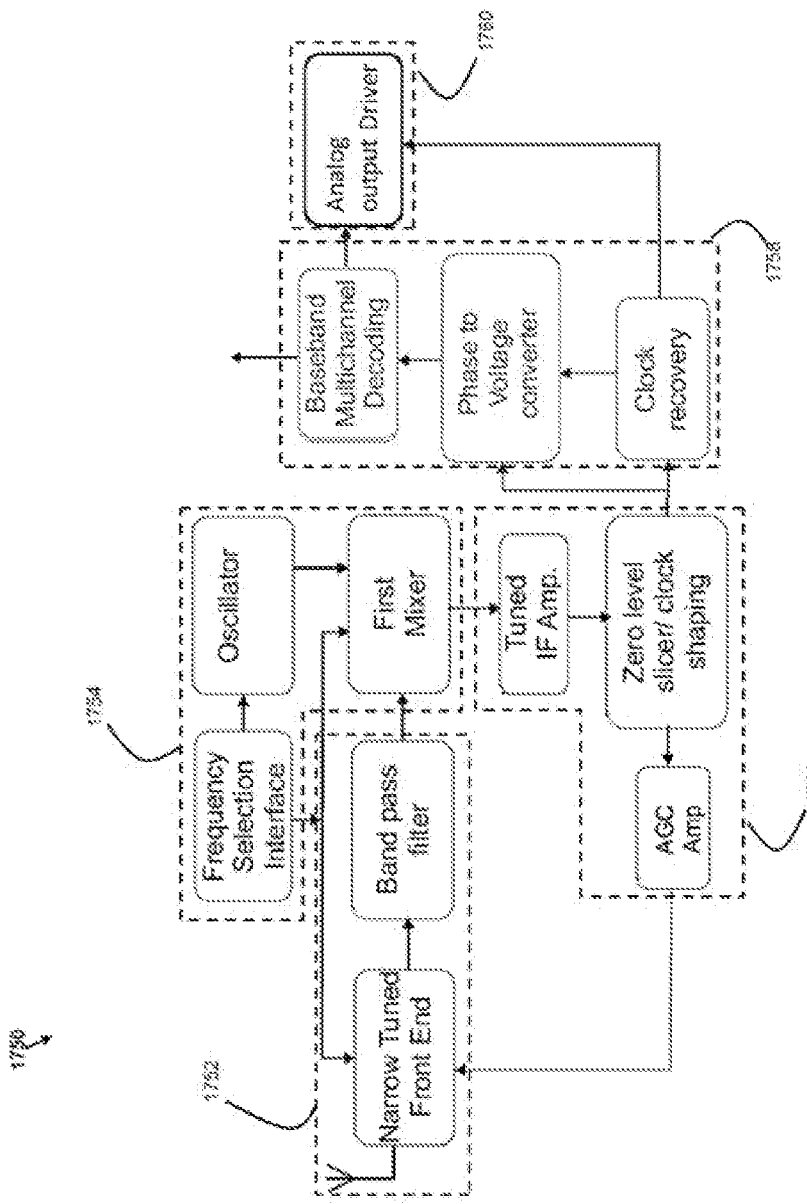
FIG. 33 illustrates the arrangement of devices inside the system for receiving modulated sinusoidal carrier wave with zero side bands to convert it into analog signals, in accordance with an embodiment of the present invention with predefined phase property.

FIG. 33 illustrates a system for receiving modulated sinusoidal carrier waves with zero side bands (612) and to convert it into analog signals, in accordance with an embodiment of the present invention. The system comprises a front end (1752) comprising of may be, but not limited to, a narrow tuned front end (1752) and band pass filter and is connected to a stabilizing module (1754). The stabilizing module (1754) comprises may be, but not limited to, frequency selection interface, AGC, oscillator and first mixer. The stabilising Module may have heterodyne process to convert sinusoidal waves in to upper or lower intermediate frequencies. The stabilizing module (1754) is connected to a processing module (1756) comprising may be, but not limited to, tuned IF amplifier. The processing module (1756) is connected to a recovery module (1758) comprising may be, but not limited to, clock recovery, wide band PM Detector, phase to voltage converter and baseband multi-channel decoding. The recovery module (1758) is connected to an output driver (1760).

FDM/QAM Modulator has been Explained as Follows: Combination

Figure 34:
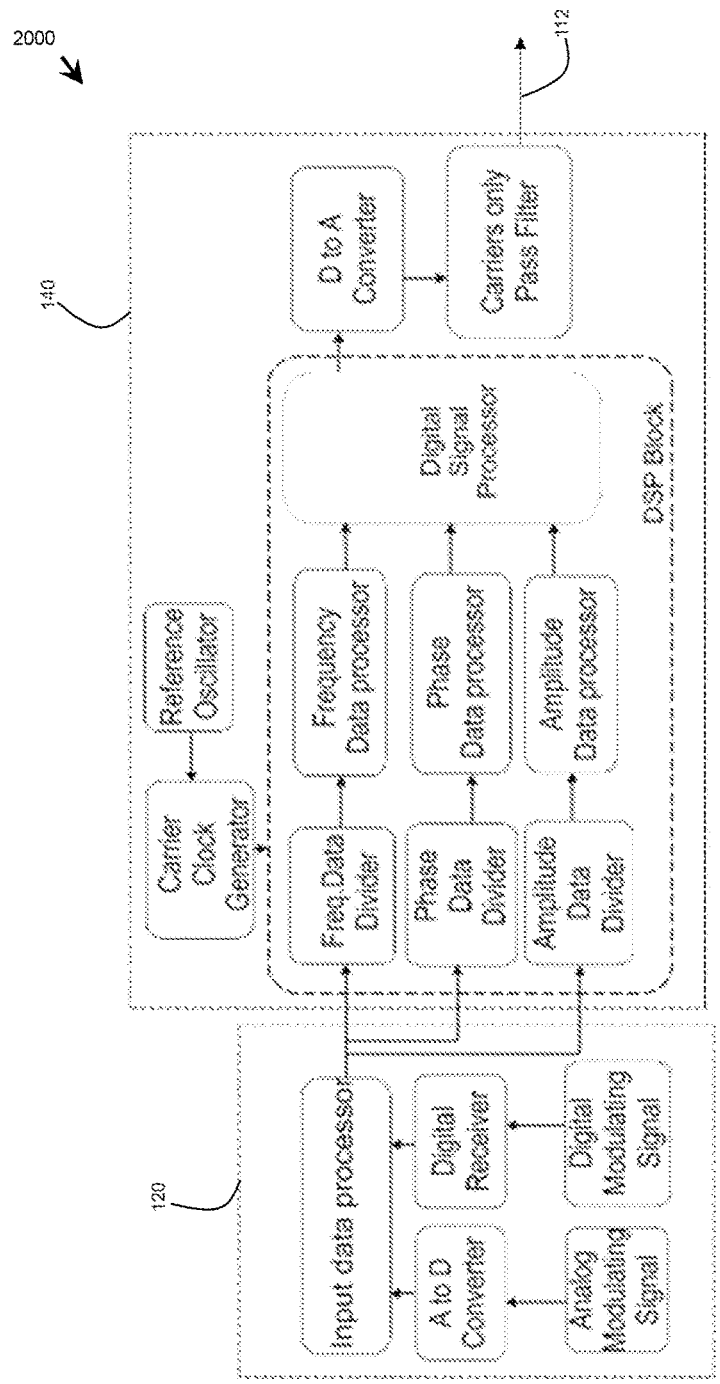
FIG. 34 illustrates the arrangement of devices inside the system for generating the modulated sinusoidal carrier wave with zero side bands, in accordance with an embodiment of the present invention with predetermined phase, frequency, amplitude, time period and combination of these properties.

FIG. 34 illustrates a system (2000) for receiving modulating signals and generating modulated sinusoidal carrier wave with zero side bands, in accordance with an embodiment of the present invention. Analog and pr digital modulating signals are received by a receiving module (120). The receiving module may have, but not limited to, input receivers, data interface, data processor and may include A to D conversion and dsp. Digital signals are received by a digital receiver and connected to Input processor. The input processor may include but not limited to a data processing to generate frequency data and or amplitude data and or phase data and or timing data or combination thereof The system (2000) for receiving a modulating signal for generating modulated sinusoidal carrier waves with zero side bands, in accordance with an embodiment of the present invention, further includes, a carrier wave module (140) which may have a reference oscillator which may include but not limited to internal precision oscillator or a GPS reference. This reference oscillator drives the carrier clock generator which may include but not limited to direct digital synthesiser, PLL, up/down converter. This clock generator may generate one or more reference clocks for the generation module. The generation module may include one or more modules selected from but not limited to Frequency data divider, phase data divider, amplitude data divider which are configured but not limited to drive frequency, phase and amplitude data processors individually and mutually. These individual processors are configured to optimise the signals/data change to be synchronisation with zero crossing of modulated sinusoidal carrier waves with zero side bands. Processed data may be but not limited to be received by the DSP processor/FPGA which are configured to generate data for one or more sinusoidal wave cycles (106) controlling and defining frequency and/or phase and/or amplitude and/or timing properties at starting zero crossing point of the one or more sinusoidal wave cycles (106) according to one or more modulating signals. In accordance with an embodiment of the present invention the output of the DSP/FPGA contains data having one or more frequencies, one or more amplitudes, one or more phase angles and one or more zero cycles with all individual carrier wave cycles (106) starting at but not limited to zero crossing point and ending at but not limited to zero crossing point of the carrier waves. The output of the DSP/FPGA may be but not limited to be converted to analog carrier waves by one or more D to A converters. The output of D to A converters may pass through a carrier only pass filters.

The Invention Works in Following Manner: Combination

The receiving module (120) FIG. 34 configured to receive one or more modulating signals (102) selected from a group comprising one or more analog signals, one or more digital signals and a combination thereof. The one or more modulating signals may have features selected from a group comprising one or more amplitudes, one or more frequencies, one or more time period, one or more phase angles and combinations thereof. The receiving module (120) may be, but not limited to, a digital signal receiving module or an analog signal receiving module or a combination thereof.

The carrier wave module (140) configured to generate a modulated sinusoidal carrier waves with zero side bands including one or more wave cycles (106) that have a predetermined one or more properties defined at one or more zero voltage crossing points in accordance with the one or more values of the one or more modulating signals. The one or more generated sine wave cycles (106) are configured to start at but not limited to the zero-voltage crossing point and end at but not limited to the consecutive zero voltage crossing point completing each cycle with constant sine wave properties. The one or more properties of each of the one or more wave cycles (106) of the one or more modulated sinusoidal carrier waves with zero side bands may be, but not limited to, selected from a group comprising one or more predetermined amplitudes, one or more predetermined frequencies, one or more predetermined phase angles, one or more predetermined time period and combination thereof. The carrier wave module may be, but not limited to, digital carrier wave module or analog carrier wave module.

Receiver [System] Combination

Figure 35:
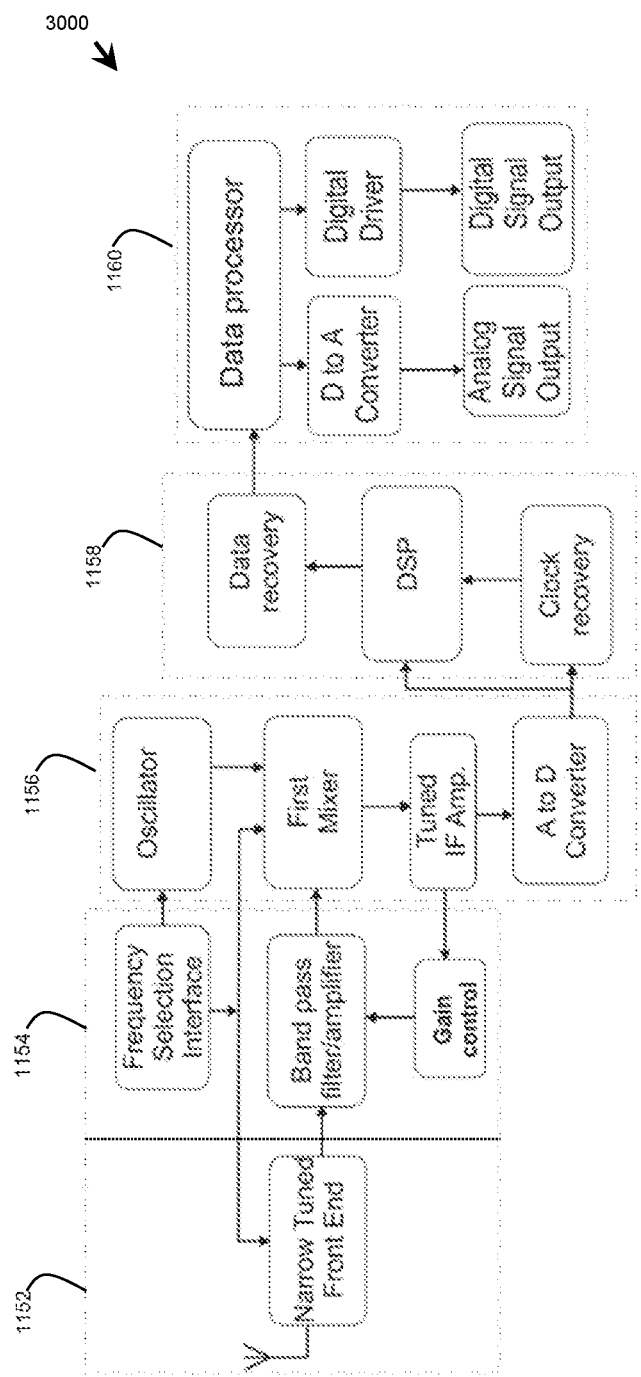
FIG. 35 illustrates the arrangement of devices inside the system for receiving the modulated sinusoidal carrier wave with zero side bands, in accordance with an embodiment of the present invention with predetermined phase, frequency, amplitude, time period and combination of these properties.

FIG. 35 illustrates a system (3000) for receiving modulated sinusoidal carrier waves with zero side bands and to convert it into signals, in accordance with an embodiment of the present invention. The front end (1152) module optimised for invented process receives the sinusoidal waves and selects the carrier frequency. The selected carrier frequency is further amplified and passed through a band pass filter to improve the selectivity and signal strength. The front end (1152) module may include but not limited to digital frequency selection module with GUI or analog module or combination thereof. The front end (1152) module may include but not limited to LNA, tuned amplifiers, filters and gain control which may not be limited to have AGC. The received sinusoidal waves by the front end (1152) may be connected to one or more mixing stages followed by tuned IF amplifiers to reduce interference and noise and further enhance signal. The tuned IF amplifier may include one or more detectors and output may be connected to but not limited to an A to D converter. The A to D converter output may be used for recovering of reference clock and drive but not limited to the DSP/FPGA. Digital Signal Processing or Analog Signal Processing may be used to process one or more received signals consisting of one or more wave cycles (106) by decoding one or more properties selected from frequency, phase, amplitude or timing and combinations thereof. Signals from DSP/FPGA will be further received by a data recovery section which may decode data from processed phase, frequency, amplitude and timing properties. Data recovery module (1158) is connected to Data processing which can process the data to drive one or more analog and digital signal output.

Different modulation types but not limited to listed here can benefit in reduction of substantial bandwidth requirement using invented method is are:

| | |
|---|---|
| PM Phase modulation or PSK Phase shift Keying | Phase Shift Keying in conventional term is achieving modulation by changing the phase angle of the carrier sine wave in response to modulating signals. This type of modulation has many variants and one of the most popularly known being QPSK (Quadrature Phase Shift Keying). All the variants need bandwidth in proportion to highest signal/data frequency and have evolved over time for specific applications with advantages. All variants of PSK either alone or in combination with other properties like amplitude or frequency can benefit from method and system of the present invention. |

| | |
|---|---|
| | Variants include but not limited to: -BPSK (binary phase-shift keying), (DBPSK (differential BPSK). DPSK (differential phase-shift keying), QPSK (Quadrature Phase Shift Keying), DQPSK (differential phase-shift keying), QAM (quadrature amplitude modulation), OFDM modulation, OFDM with QPSK. OQPSK also known as SQPSK (Offset Quadrature Phase Shift Keying), BPSK or PRK, phase reversal keying, or 2PSK, SOQPSK (shaped-offset QPSK), Continuous phase modulation (CPM) and many more fine variants of these. |
| OOK On Off Keying | (ASK) Amplitude-shift keying is the most basic and one of the earliest modulation schemes. It basically switches ON or OFF the basic carrier itself under control of the modulating signal which is mostly digital or manual. Variants include but not limited to: - ASK Amplitude Shift Keying, it is frequently used in optical communication systems. With addition phase shift to it, becomes APSK. |
| AM Amplitude Modulation | Amplitude modulation is quite common and is implemented by variation of the carrier wave amplitude in response to modulating signal. Variants include but not limited to: - double side band, Single Side band, Vestigial side band, suppressed carrier and variants of this. In addition, its combinations with Phase Shift and frequency shift are also there. |
| FM | FM is a method of transferring information by changing frequency in proportion to the modulating signal. It is widely used in broadcasting and other communication systems independently. FM can also be combined with AM and other modulation processes to conserve transmission bandwidth. Variants include but not limited to: Frequency Modulation, FSK is another form of frequency modulation. Multiple frequency shift keying and minimum shift keying are the other variants of FM with additional parameters. MFSK system is dual-tone multi-frequency (DTMF), OFDM is a frequency-division multiplexing (FDM), QPSK, and others |
| QAM and other combinations | Phase Modulation in combination to amplitude and frequency are used in modern digital communication systems. Its most popular variant is with its combination with amplitude modulation known as QAM and its variants. |

The present invention has various advantages. The system and method can provide solution for transmission of data and high bandwidth signals using narrow channel band width up to zero hertz. Another advantage includes production of zero sidebands, which results in carrier frequency itself carrying the vast amount of data and other signals offering better utilization of spectrum bandwidth. In other words, more information can be transmitted using limited spectrum up to a single frequency. Another advantage of the invention is reduction in noise density for the received carrier signals. The advantage will majorly depend on use of technique to limit the bandwidth of received channel in practice to below 100 Hz or 10 Hz. For a received device bandwidth reduction from 10 KHz to 100 Hz will provide a noise floor reduction of about 40 dB.

Various modifications to these embodiments are apparent to those skilled in the art from the description and the accompanying drawings. Ancillaries like transmit and receive antennas may be included to complete the systems. The principles associated with the various embodiments described herein may be applied to other embodiments. Therefore, the description is not intended to be limited to the embodiments shown along with the accompanying drawings but is to be providing broadest scope consistent with the principles and the novel and inventive features disclosed or suggested herein. Reference to digital and Analog signals include combination thereof, also reference to one and/or more is meant to include fractional values in specific terms. Generation of carrier waves to include other similar contextual meaning words like producing, creating etc. Accordingly, the invention is anticipated to hold on to all other such alternatives, modifications, and variations that fall within the scope of the present invention.

In general, the word "module," as used herein, refers to logic embodied in hardware or firmware, and may include a collection of software instructions, written in a programming language, such as, for example, Java, C, or assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may alternatively be implemented as either software and/or hardware modules and may be stored in any type of computer-readable medium or other computer storage device.

Further, while one or more operations have been described as being performed by or otherwise related to certain modules, devices or entities, the operations may be performed by or otherwise related to any module, device or entity. As such, any function or operation that has been described as being performed by a module could alternatively be performed by a different server, by the cloud computing platform, or a combination thereof.

Further, the operations need not be performed in the disclosed order, although in some examples, an order may be preferred. Also, not all functions need to be performed to achieve the desired advantages of the disclosed system and method, and therefore not all functions are required.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claims.

The invention claimed is:

1. A method (1100) for reception of a signal using carrier frequency itself with zero side bands, the method (1100) comprising the steps of:
   receiving (1102) one or more modulated sinusoidal carrier waves with zero side bands (112);
   optimising (1104) the one or more modulated sinusoidal carrier waves with zero side bands (112);
   processing (1106) the one or more modulated sinusoidal carrier waves with zero side bands (112);
   recovering (1108) signal from the one or more modulated sinusoidal carrier waves with zero side bands (112); and
   providing (1110) one or more output signals;
   wherein processing the one or more modulated sinusoidal carrier waves with zero side bands (112) further includes analysing one or more properties of each of the one or more wave cycles (104) of the one or more modulated sinusoidal carrier waves with zero side bands (112) at and between zero voltage crossing points to determine value of one or more properties of each cycle of the one or more wave cycles (104) of the one or more modulated sinusoidal carrier waves with zero side bands (112).

2. The method (1100) as claimed in claim 1, wherein receiving the one or more modulated sinusoidal carrier waves with zero side bands (112) includes receiving, amplifying the one or more modulated sinusoidal carrier waves with zero side bands (112) and selecting one or more carrier wave frequency.

3. The method (1100) as claimed in claim 1, wherein optimising the one or more modulated sinusoidal carrier waves with zero side bands (112) includes stabilizing the received one or more modulated sinusoidal carrier waves with zero side bands (112), filtering the stabilized one or more modulated sinusoidal carrier waves with zero side bands (112) and eliminating noise and interference from the one or more unwanted sinusoidal carrier waves (112).

4. The method (1100) as claimed in claim 1, where in processing the one or more modulated sinusoidal carrier waves with zero side bands (112) includes amplifying the filtered modulated sinusoidal carrier waves with zero side bands, controlling gain and demodulating information.

5. The method (1100) as claimed in claim 4, wherein processing further includes step of converting the one or more modulated sinusoidal carrier waves with zero side bands (112) into one or more pulses.

6. The method (1100) as claimed in claim 5, wherein processing further includes step of converting the one or more modulated sinusoidal carrier waves with zero side bands (112) into upper or lower intermediate frequency by heterodyne process.

7. The method (1100) as claimed in claim 1, wherein providing recovered signal to form the one or more output signal selected from a group comprising one or more digital signals, one or more analog signals and combinations thereof.

8. The method (1100) as claimed in claim 1, wherein the one or more modulated sinusoidal carrier waves with zero side bands (112) having the one or more properties of each cycle of the one or more wave cycles (104) of received the one or more modulated sinusoidal carrier waves with zero side bands (112) is selected from a group comprising one or more predetermined amplitudes, one or more predetermined frequencies, one or more predetermined phase angles, one or more predetermined time periods and combination thereof.

9. The method (1100) as claimed in claim 1, wherein the one or more modulated sinusoidal carrier waves with zero side bands (112) having the one or more properties of each cycle of the one or more wave cycles (104) of received one or more modulated sinusoidal carrier waves with zero side bands (112) is the one or more predetermined amplitudes, having a constant frequency and a constant phase angle.

10. The method (1100) as claimed in claim 1, wherein the one or more modulated sinusoidal carrier waves with zero side bands (112) having the one or more properties of each cycle of the one or more wave cycles (104) of received one or more modulated sinusoidal carrier waves with zero side bands (112) is the one or more predetermined frequencies, having a constant amplitude and a constant phase angle.

11. The method (1100) as claimed in claim 1, wherein the one or more modulated sinusoidal carrier waves with zero side bands (112) having the one or more properties of each of the one or more wave cycles (104) of received one or more modulated sinusoidal carrier waves with zero side bands (112) is the one or more predetermined phase angle, one or more predetermined time period and combinations of these, having a constant amplitude and a constant frequency.

12. A system (1150) for reception of a signal using carrier frequency itself with zero side bands, the system (1150) comprising:
a front end module (1152) configured to receive one or more modulated sinusoidal carrier waves with zero side bands (112);
a stabilizing module (1154) configured to optimise the one or more modulated sinusoidal carrier waves with zero side bands (112);
a processing module (1156) configured to process the one or more modulated sinusoidal carrier waves with zero side bands (112);
a recovery module (1158) configured to recover data from the one or more modulated sinusoidal carrier wave with zero side bands; and
an output driver module (1160) configured to provide the output signal;
wherein the processing module (1156) is configured to process the one or more modulated sinusoidal carrier waves with zero side bands (112) further includes analyse one or more properties of each cycle of the one or more wave cycles (104) of the one or more modulated sinusoidal carrier waves with zero side bands (112) at and between zero voltage crossing points to determine value of one or more properties of each cycle of the one or more wave cycles (104) of the one or more modulated sinusoidal carrier waves with zero side bands (112).

13. The system (1150) as claimed in claim 12, wherein the front end module (1152) is configured to receive the one or more modulated sinusoidal carrier waves with zero side bands (112) includes receive, amplify the one or more modulated sinusoidal carrier waves with zero side bands (112) and select one or more carrier wave frequency.

14. The system (1150) as claimed in claim 12, wherein the stabilizing module (1154) is configured to optimise the one or more modulated sinusoidal carrier waves with zero side bands (112) include stabilize, filter and eliminate noise and interference from the unwanted one or more sinusoidal carrier waves (112).

15. The system (1150) as claimed in claim 12, wherein the processing module (1156) is further configured to amplify the filtered modulated sinusoidal carrier wave with zero side bands, control gain and demodulate information.

16. The system (1150) as claimed in claim 15, wherein the processing module (1156) is further configured to convert the one or more modulated sinusoidal carrier waves with zero side bands (112) into one or more pulses.

17. The system (1150) as claimed in claim 12, wherein recovered signal to form the one or more output signals are selected from a group comprising one or more digital signals, one or more analog signals and combinations thereof.

18. The system (1150) as claimed in claim 12, wherein the received one or more modulated sinusoidal carrier waves with zero side bands (112) have the one or more properties of each cycle of the one or more wave cycles (104) of the one or more modulated sinusoidal carrier waves with zero side bands (112) is selected from a group comprising one or more predetermined amplitudes, one or more predetermined frequencies, one or more predetermined phase angles, one or more predetermined time periods and combinations thereof.

19. The system (1150) as claimed in claim 12, wherein the one or more modulated sinusoidal carrier waves with zero side bands (112) have the one or more properties of each cycle of the one or more wave cycles (104) of received one or more modulated sinusoidal carrier waves with zero side bands (112) is the one or more predetermined amplitudes, have a constant frequency and a constant phase angle.

20. The system (1150) as claimed in claim 15, wherein one or more modulated sinusoidal carrier waves with zero side bands (112) have the one or more properties of each cycle of the one or more wave cycles (104) of received one or more modulated sinusoidal carrier waves with zero side bands (112) is the one or more predetermined frequencies, have a constant amplitude and a constant phase angle.

21. The system (1150) as claimed in claim 12, wherein the one or more modulated sinusoidal carrier waves with zero side bands (112) have the one or more properties of each cycle of the one or more wave cycles (104) of received one or more modulated sinusoidal carrier waves with zero side bands (112) is the one or more predetermined phase angle, the one or more time period and combinations thereof, have a constant amplitude and a constant frequency.

\* \* \* \* \*